(12) United States Patent
Ebiko et al.

(10) Patent No.: US 9,647,026 B2
(45) Date of Patent: May 9, 2017

(54) SOLID-STATE IMAGE PICKUP DEVICE, METHOD OF MANUFACTURING THE SAME, AND ELECTRONIC APPARATUS

(71) Applicant: Sony Corporation, Tokyo (JP)

(72) Inventors: Yoshiki Ebiko, Kanagawa (JP); Atsuhiko Yamamoto, Kanagawa (JP); Yasushi Tateshita, Kanagawa (JP); Hiromi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 14/449,825

(22) Filed: Aug. 1, 2014

(65) Prior Publication Data

US 2015/0041942 A1    Feb. 12, 2015

(30) Foreign Application Priority Data

Aug. 9, 2013    (JP) .................................. 2013-166856

(51) Int. Cl.
  *H01L 21/00*        (2006.01)
  *H01L 27/146*       (2006.01)
(52) U.S. Cl.
  CPC .... *H01L 27/14685* (2013.01); *H01L 27/1463* (2013.01); *H01L 27/14629* (2013.01)
(58) Field of Classification Search
  CPC ......... H01L 27/14685; H01L 27/14629; H01L 27/1463
See application file for complete search history.

(56) References Cited

U.S. PATENT DOCUMENTS

| | | | |
|---|---|---|---|
| 5,861,104 A * | 1/1999 | Omid-Zohoor ... | H01L 21/76232 216/84 |
| 9,105,789 B2 * | 8/2015 | Mazzillo et al. | |
| 2009/0200590 A1 * | 8/2009 | Mao et al. ..................... | 257/292 |
| 2012/0153127 A1 * | 6/2012 | Hirigoyen ......... | H01L 27/14609 250/208.1 |
| 2012/0161270 A1 * | 6/2012 | Maehara ................ | B82Y 10/00 257/432 |
| 2012/0187280 A1 * | 7/2012 | Kerness ................ | H01L 31/167 250/214.1 |
| 2013/0134536 A1 * | 5/2013 | Mori et al. ..................... | 257/432 |
| 2013/0285181 A1 * | 10/2013 | Lin ..................... | H01L 27/1464 257/432 |
| 2014/0016012 A1 * | 1/2014 | Oishi ..................... | H04N 5/372 348/311 |

(Continued)

FOREIGN PATENT DOCUMENTS

JP    2009-065098 A    3/2009

*Primary Examiner* — Trung Q Dang
*Assistant Examiner* — Wasiul Haider
(74) *Attorney, Agent, or Firm* — Sheridan Ross P.C.

(57) ABSTRACT

A solid-state image pickup device, including: a plurality of pixels; a separation structure provided along a boundary line adjacent to the plurality of pixels; the separation structure includes a groove provided from a back surface of the semiconductor substrate to a depth corresponding to a wavelength, the groove being positioned along the boundary line, a first separation layer provided in the groove, and a second separation layer provided above the first separation layer and corresponding to the boundary line, the second separation layer being connected to the first separation layer; and methods including the same.

8 Claims, 21 Drawing Sheets

(56) References Cited

U.S. PATENT DOCUMENTS

| | | | | |
|---|---|---|---|---|
| 2014/0054662 A1* | 2/2014 | Yanagita | ........... | H01L 27/14629 |
| | | | | 257/291 |
| 2014/0159184 A1* | 6/2014 | Lim | ................. | H01L 27/14621 |
| | | | | 257/432 |
| 2014/0235008 A1* | 8/2014 | JangJian | ........... | H01L 21/02112 |
| | | | | 438/70 |
| 2014/0367821 A1* | 12/2014 | Ootsuka | ............ | H01L 27/14623 |
| | | | | 257/432 |
| 2015/0263060 A1* | 9/2015 | Park | ................. | H01L 31/02240 |
| | | | | 257/432 |
| 2016/0064437 A1* | 3/2016 | Kawashima | ...... | H01L 27/14623 |
| | | | | 257/229 |

* cited by examiner (1)

SOLID-STATE IMAGE PICKUP DEVICE, METHOD OF MANUFACTURING THE SAME, AND ELECTRONIC APPARATUS

CROSS REFERENCE TO RELATED APPLICATION

This application claims the benefit of Japanese Priority Patent Application JP 2013-166856 filed Aug. 9, 2013, the entire contents of which are incorporated herein by reference.

BACKGROUND

The present disclosure relates to a solid-state image pickup device that is favorably used as a backside illumination type solid-state image pickup device that makes light incident upon a photoelectric conversion section from a back surface side of a semiconductor substrate, a method of manufacturing the same, and an electronic apparatus including the solid-state image pickup device.

As pointed out, for example, in Japanese Unexamined Patent Application Publication No. 2009-65098, the backside illumination type solid-state image pickup device may have a disadvantage because oblique incident light enters a pixel that is adjacent to a target pixel, which causes color mixing. Therefore, a configuration in which a shading member that separates one color filter from the other color filter is embedded down into a high-concentration p+ layer on the back surface side of the semiconductor substrate, is described in Japanese Unexamined Patent Application Publication No. 2009-65098.

SUMMARY

However, in the configuration described in Japanese Unexamined Patent Application Publication No. 2009-65098, it is difficult to suppress color mixing because the depth down to which the shading member is embedded into the semiconductor substrate is shallow.

It is desirable to provide a solid-state image pickup device that makes it possible to suppress color mixing, a method of manufacturing the same, and an electronic apparatus that includes the solid-state image pickup device.

According to illustrative embodiments of the present disclosure, there is provided a solid-state image pickup device, including: a plurality of pixels; a separation structure provided along a boundary line adjacent to the plurality of pixels; the separation structure includes a groove provided from a back surface of the semiconductor substrate to a depth corresponding to a wavelength, the groove being positioned along the boundary line, a first separation layer provided in the groove, and a second separation layer provided above the first separation layer and corresponding to the boundary line, the second separation layer being connected to the first separation layer.

Further illustrative embodiments include a method of manufacturing a solid-state image pickup device, the method including: providing a plurality of pixels; providing a groove from a back surface of a semiconductor substrate down to a depth corresponding to a wavelength, the groove being positioned along a boundary line adjacent to the plurality of pixels; forming a cover layer on the back surface of the semiconductor substrate, the cover layer having an opening corresponding to the groove; forming a first separation layer in the groove and forming a second separation layer in the opening by embedding an embedding film into the groove, the opening, and at least a portion of the cover layer, where the second separation layer is connected to the first separation layer; removing the embedding film that is formed on the portion of the cover layer; and removing the cover layer.

Still further illustrative embodiments include a method of manufacturing a solid-state image pickup device, the method including: providing a plurality of pixels; providing a groove from a back surface of a semiconductor substrate to a depth corresponding to a wavelength, the groove being positioned along a boundary line adjacent to the plurality of pixels; embedding an embedding film into the groove and covering the back surface of the semiconductor substrate with the embedding film; forming a mask material layer on an upper surface of the embedding film; polishing the mask material layer to form a mask layer on the upper surface of the embedding film at a position facing the groove; forming a first separation layer in the groove and a second separation layer between the groove and the mask layer by etching back the embedding film, the second separation layer being connected to the first separation layer.

Yet further illustrative embodiments include an electronic apparatus including the solid-state image-pickup device as described herein.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, embodiments of the present disclosure will be described in detail with reference to the accompanying drawings. The description will be made in the following order.
1. First Embodiment (an example that a cover layer is formed on a back surface side of a semiconductor substrate, an opening that communicates with a groove is provided in the cover layer, and a first separation layer is formed integrally with a second separation layer by embedding an embedding film into the groove and the opening)
2. Second Embodiment (an example that the first separation layer is formed integrally with the second separation layer by etching back the embedding film)
3. General Configuration Example of Solid-State Image Pickup Device
4. Application Example (an example of an electronic apparatus)

First Embodiment

Figure 1:
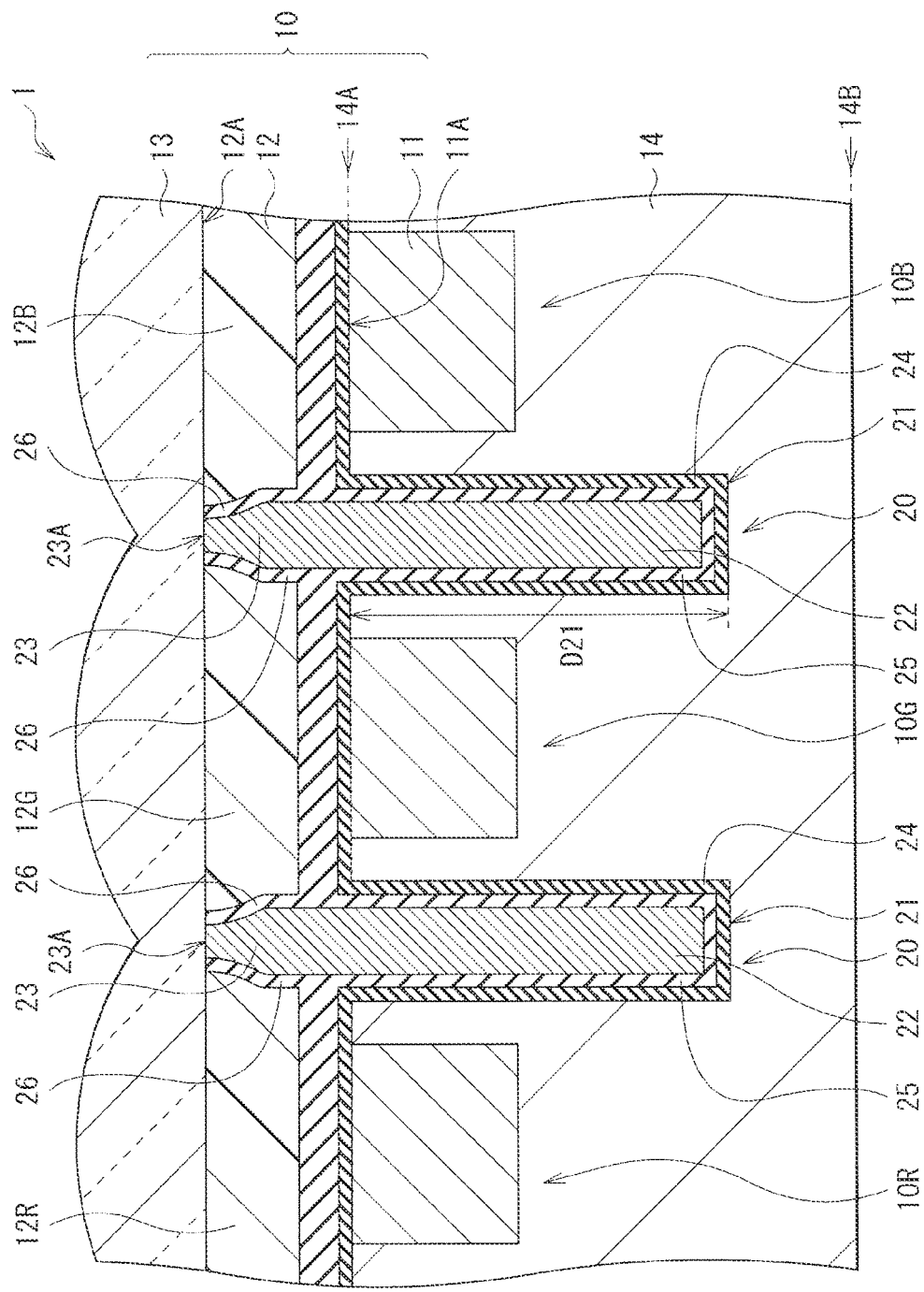
FIG. 1 is an illustrative sectional diagram showing a configuration example of a solid-state image pickup device pertaining to a first embodiment of the present disclosure.

FIG. 1 is an illustrative sectional diagram showing a configuration example of a solid-state image pickup device 1 pertaining to the first embodiment of the present disclosure. The solid-state image pickup device 1 may be a CMOS image sensor to be used in electronic apparatuses such as a digital still camera, a video camera and so forth, and has a configuration in which a plurality of pixels 10 are two-dimensionally arranged in an image pickup pixel region (a later-described pixel section 110). A separation structure 20 is provided along a boundary line between the pixels 10. Although the solid-state image pickup device 1 may have either a backside illumination type structure or a front-side illumination type structure, the description is given with a solid-state image pickup device having the backside illumination type structure as an illustrative example.

The pixel 10 may include, for example, a color filter 12 and an on-chip lens 13 on a light incident side of a photoelectric conversion element 11 configured by a photodiode. The pixel 10 may include, for example, a red pixel 10R that detects a wavelength of red (R) light, a green pixel 10G that detects a wavelength of green (G) light, and a blue pixel 10B that detects a wavelength of blue (B) light. It is to be noted that the red (R) light may be color light corresponding to, for example: a wavelength region from approximately 620 nm to approximately 750 nm, both inclusive; the green (G) light may be color light corresponding to, for example, a wavelength region from approximately 495 nm to approximately 570 nm, both inclusive; and the blue (B) light may be color light corresponding to, for example, a wavelength region from approximately 450 nm to approximately 495 nm, both inclusive, respectively.

Figure 2:
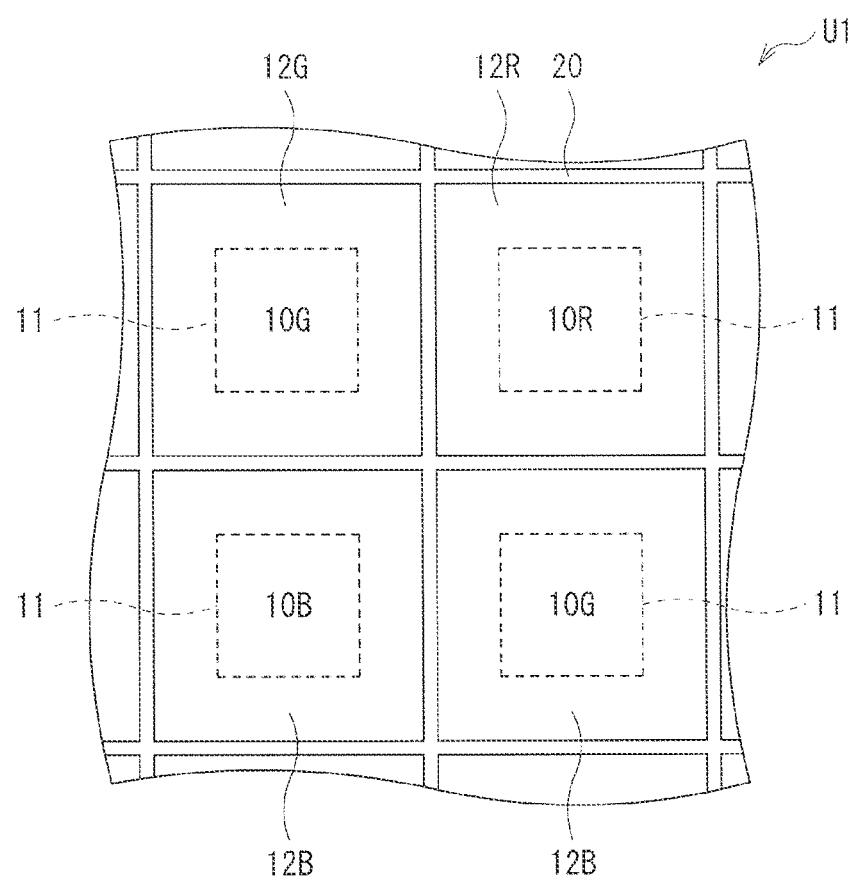
FIG. 2 is an illustrative plan view showing a configuration example of the solid-state image pickup device shown in FIG. 1.

The red pixel 10R, the green pixel 10G, and the blue pixel 10B may be square pixels that are arranged in, for example, a Bayer array as shown in FIG. 2. That is, two green pixels 10G, one red pixel 10R and one blue pixel 10B configure a unit array U1 of two rows by two columns. The green pixels 10G are arranged on an upper left side and a lower right side along one diagonal line of the unit array U1. The red pixel 10R and the blue pixel 10B are arranged on an upper right side and a lower left side respectively along the other diagonal line of the unit array U1. The separation structure 20 is provided along a boundary line between the pixels 10 in a lattice-like shape.

The photoelectric conversion element 11 (the photodiode) illustrated in FIG. 1 may be provided on a back surface 14A side of a semiconductor substrate 14 made of silicon (Si) with a thickness of, for example, approximately several micrometers. The photoelectric conversion element 11 includes a light receiving surface 11A on the back surface 14A of the semiconductor substrate 14.

Though not shown in FIG. 1, a transfer transistor, a selection transistor, a modulation transistor, a reset transistor, an FD (a floating diffusion: floating diffusion layer), a multilayer wiring and so forth are provided on a front surface 14B side of the semiconductor substrate 14 shown in FIG. 1. The transfer transistor is a switching element adapted to transfer charges accumulated in the photoelectric conversion element 11 to the FD. The FD is connected to a signal processing section (not shown) via the multilayer wiring. The FD may be shared among the plurality of pixels (for example, four pixels). The multilayer wiring is adapted to drive the photoelectric conversion element 11 and to perform signal transfer, voltage application to respective sections and so forth. It is to be noted that a support substrate (not illustrated) may be bonded to the front surface 14B side of the semiconductor substrate 14.

The color filter 12 shown in FIG. 1 may include, for example, a red filter 12R, a green filter 12G, and a blue filter 12B. The red filter 12R is adapted to acquire a signal corresponding to the wavelength region of red light from the photoelectric conversion element 11. The green filter 12G is adapted to acquire a signal corresponding to the wavelength region of green light from the photoelectric conversion element 11. The blue filter 12B is adapted to acquire a signal corresponding to the wavelength region of blue light from the photoelectric conversion element 11. Each of the color filters 12 (that is, the red filter 12R, the green filter 12G, and the blue filter 12B) may be made of, for example, a resin mixed with a pigment and may be adjusted such that a light transmittance in the target wavelength region of red light, green light, or blue light is increased and light transmittances in other wavelength regions are decreased by selecting the pigment concerned.

The on-chip lens 13 shown in FIG. 1 is arranged on a light incident side of the color filter 12 and is adapted to condense light that has been entered from above onto the light receiving surface 11A of the photoelectric conversion element 11.

The separation structure 20 shown in FIG. 1 includes a groove (or a trench) 21, a first separation layer 22, and a second separation layer 23. The groove 21 is provided from the back surface 14A of the semiconductor substrate 14, down to a depth D21 corresponding to a wavelength or a range of wavelengths, or where photoelectric conversion of specific color light occurs along a boundary line between the photoelectric conversion elements 11. The first separation layer 22 is provided in the groove 21. The second separation layer 23 is provided along a boundary line between the color filters 12, is formed integrally with the first separation layer 22, and is made of the same material as the first separation layer 22. As used herein, the term integrally includes, e.g., that the components are formed as a single piece, that they are in contact, that they are connected and/or associated, and that the components being integrally formed cannot be separated from each other. Accordingly, it is possible for the solid-state image pickup device 1 to reduce or completely suppress color mixing.

The first separation layer 22 is adapted to suppress color mixing (intra-bulk color mixing) that occurs in the semiconductor substrate 14 and is embedded into the groove 21. It is to be noted that groove 21 may have a width of, for example, approximately 100 nm.

Here, the "specific color light" may be, for example, red light or green light. Since almost 99% of the green light may be advantageously absorbed in a depth, for example, of approximately 2.8 µm to approximately 2.9 µm both inclusive, it is possible to reduce or completely suppress color mixing (intra-bulk color mixing) that occurs in the semiconductor substrate 14 by providing the groove 21 down to the depth D21 where photoelectric conversion of the green light occurs.

The second separation layer 23 is adapted to suppress color mixing (upper layer color mixing) that occurs on the upper layer side (the color filter 12 side) situated above the back surface 14A of the semiconductor substrate 14. The second separation layer 23 may have a tapered and pointed shape and the width may be gradually narrowed with distance from the first separation layer 22. As used herein, a tapered shape may include e.g., a shape that becomes smaller or narrower or thinner towards one end. The taper may be of varying lengths and may begin and end at various distances in a direction perpendicular to the substrate. In addition, the tapered shape may begin or end or vary within various components and layers of the embodiments described herein. Other components and films may also have the tapered shape. The exact shape of the taper is described illustratively herein and is not limited by the description. Accordingly, a tapered structure of a side face of the second separation layer 23, functions like a waveguide to make it possible to omit pupil correction of the on-chip lens 13.

The first separation layer 22 and the second separation layer 23 may be made of, for example, a metal. Examples of the metal may include tungsten (W), silver (Ag), aluminum (Al), Rh (rhodium), and so forth. A, high-reflectance metal may be used.

Alternatively, it may be that the first separation layer 22 and the second separation layer 23 be made of a material that is lower in refractive index than the material of the color filter 12. Examples of such a material may include insulating films such as Low-k (e.g., low dielectric constant) films and so forth.

A pinning film (a film having a negative fixed charge) 24 and an insulating film 25 may be provided on an inner surface of the groove 21 (e.g., between the groove 21 and the first separation layer 22). The pinning film 24 may be made of, for example, $Ta_2O_5$, $HfO_2$, $Al_2O_3$, $TiO_2$ and so forth. The insulating film 25 may be made of, for example, $SiO_2$ and so forth.

An antireflection film 26 may be provided on a front surface of the second separation layer 23. Examples of the material of the antireflection film 26 may include barrier metal such as TiN and so forth and silicon compounds such as SiN, SiON and so forth.

An upper surface 23A of the second separation layer 23 may be level with (e.g., be flush) the light incident surface 12A of the color filter 12 or be situated at a position higher than the light incident surface 12A of the color filter 12 (e.g., a position that protrudes beyond the light incident surface 12A of the color filter 12), because it becomes possible for the second separation layer 23 to reduce or completely suppress color mixing.

When the upper surface 23A of the second separation layer 23 is situated at the position higher than the light incident surface 12A of the color filter 12, the antireflection film 26 may be provided up to the upper surface 23A of the second separation layer 23. Owing to this, light from outside is reflected by the upper surface 23A of the second separation layer 23 and it becomes possible to suppress incidence of reflected light upon a lens and so forth of a camera.

The solid-state image pickup device 1 may be manufactured, for example, in the following manner.

Figure 3:
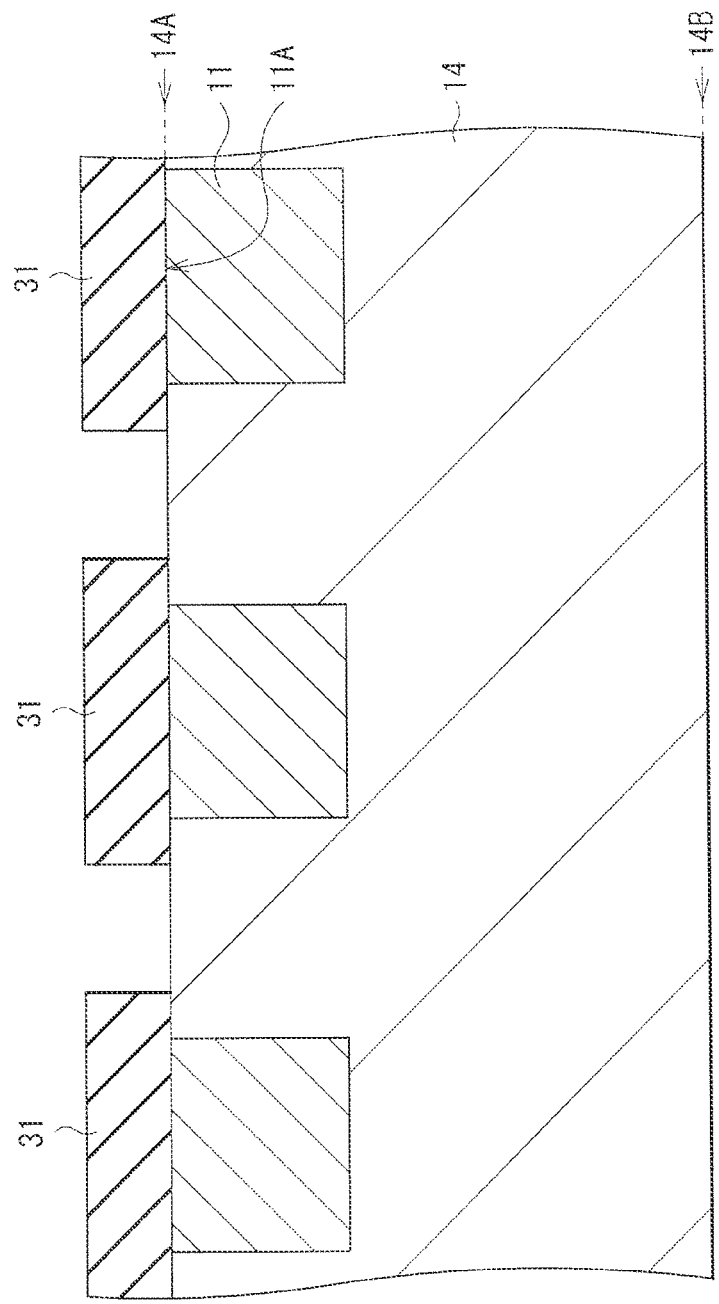
FIG. 3 is an illustrative sectional diagram showing an example of a method of manufacturing the solid-state image pickup device shown in FIG. 1 in order of the processes.

FIG. 3 to FIG. 10 are diagrams showing an illustrative example of a method of manufacturing the solid-state image pickup device 1 in order of processes. First, the photoelectric conversion element 11 is provided in the semiconductor substrate 14 and the back surface 14A of the semiconductor substrate 14 is polished to form the light receiving surface 11A of the photoelectric conversion element 11 as shown in FIG. 3.

Next, a hard mask 31 for trench machining is formed on the back surface 14A of the semiconductor substrate 14 as also shown in FIG. 3.

Figure 4:
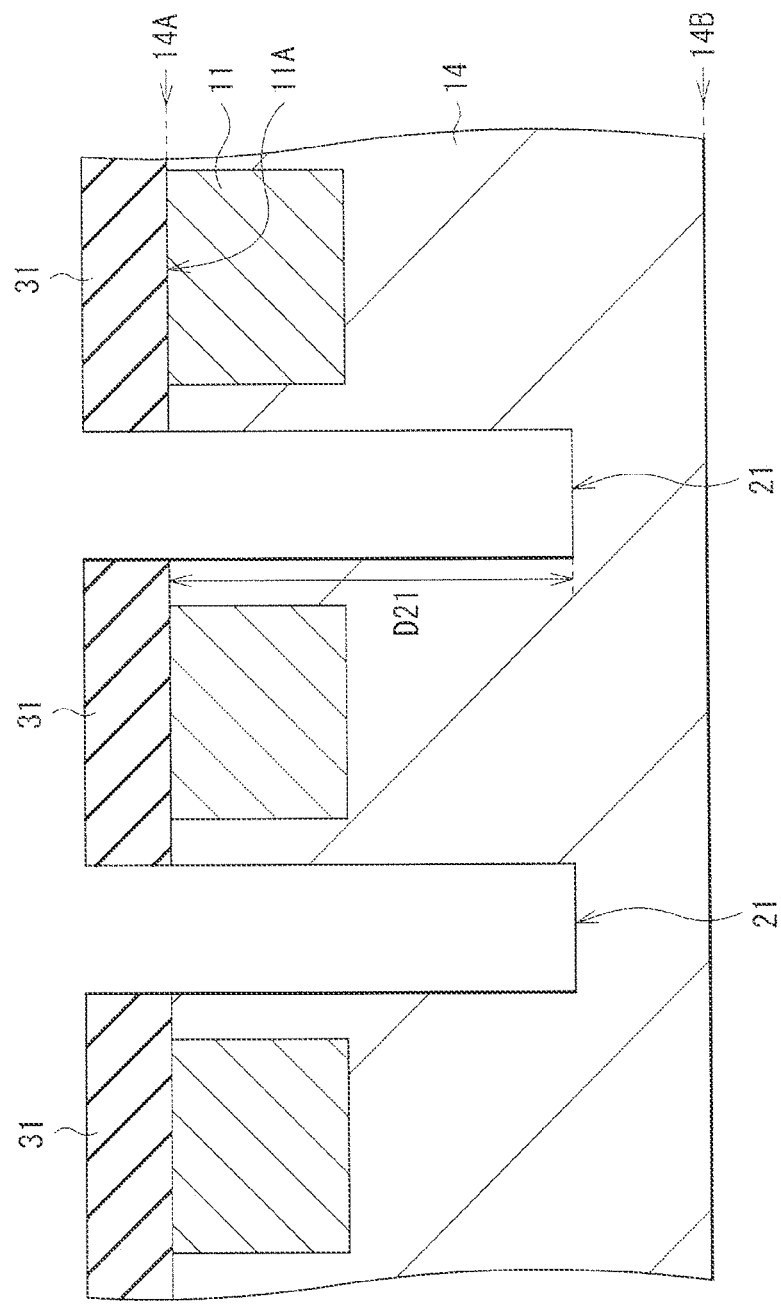
FIG. 4 is an illustrative sectional diagram showing a process following the processes in FIG. 3.

Then, the semiconductor substrate 14 is machined into a trench-like shape by using the hard mask 31 to form the groove 21 as shown in FIG. 4. The groove 21 may be provided from the back surface 14A of the semiconductor substrate 14 down to the depth D21 corresponding to a wavelength or a range of wavelengths, or where photoelectric conversion of the specific color light, for example, green light occurs. After the groove 21 is provided, the hard mask 31 is removed.

Figure 5:
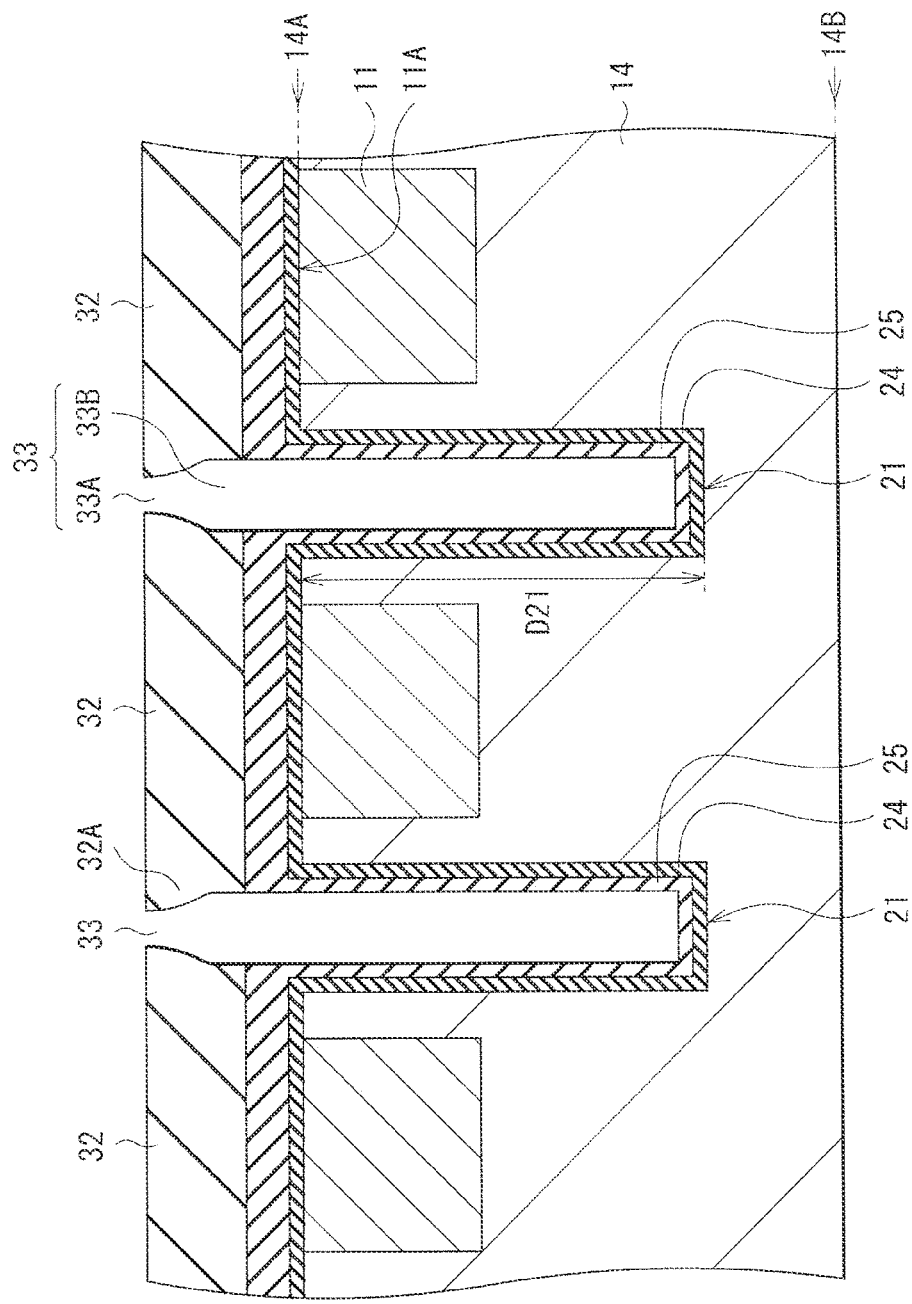
FIG. 5 is an illustrative sectional diagram showing a process following the process in FIG. 4.

Thereafter, the pinning film 24 made of $Ta_2O_5$, $HfO_2$, $Al_2O_3$, $TiO_2$ and so forth is deposited on the inner surface of the groove 21 and the back surface 14A of the semiconductor substrate 14 as shown in FIG. 5. Then, the insulating film 25 made of $SiO_2$ and so forth is formed.

Then, the cover layer 32 is formed on the back surface 14A side of the semiconductor substrate 14 as also shown in FIG. 5. At that time, the cover layer 32 is cut into sections on the grooves 21 without being connected together striding over the groove 21. Therefore, an opening 33 that communicates with the groove 21 is formed in the cover layer 32. Examples of the material of the cover layer 32 may include other oxide films made of $SiO_2$, $Ta_2O_5$ and so forth.

In a process of forming the cover layer 32, an overhang part 32A may be formed that narrows an inlet 33A of the opening 33 on an end of the cover layer 32. The overhang part 32A is so formed as to hang down into the inlet 33A of the opening 33. Thus, the opening 33 is formed into a shape that its diameter is increased from the inlet 33A toward an inner part 33B. The reason therefor will be described later.

Figure 6:
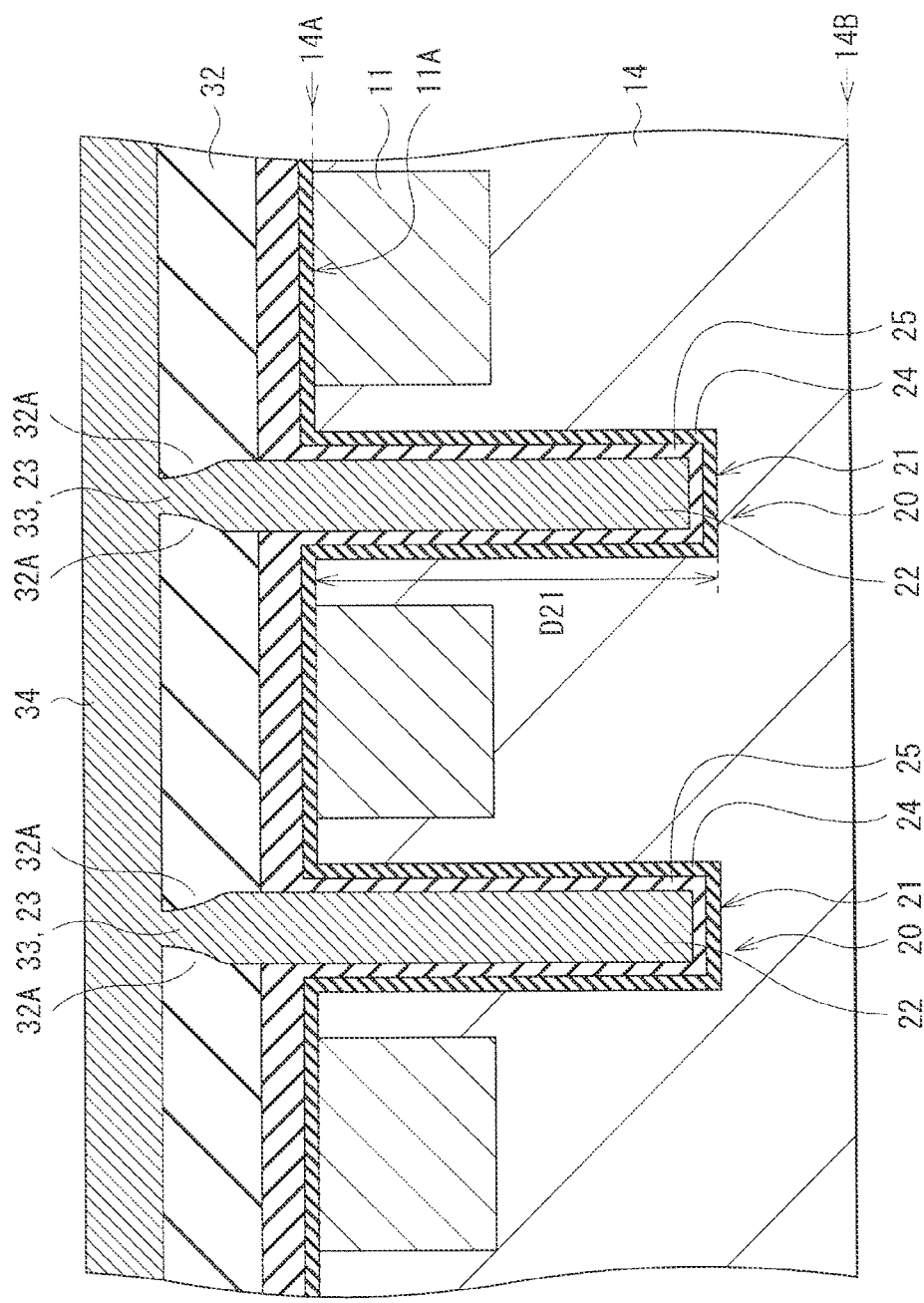
FIG. 6 is an illustrative sectional diagram showing a process following the process in FIG. 5.

After the cover layer 32 is formed, an embedding film 34 may be embedded into the groove 21 and the opening 33, for example, by a CVD (Chemical Vapor Deposition) method or an ALD (Atomic Layer Deposition) method as shown in FIG. 6. Consequently, the first separation layer 22 is formed in the groove 21 and the second separation layer 23 is formed in the opening 33. The second separation layer 23 is formed integrally with the first separation layer 22 and is made of the same material as the first separation layer 22 in this way.

Here, the overhang part 32A that narrows the inlet 33A of the opening 33 may be formed on the end of the cover layer 32 in the process of forming the cover layer 32 as described above. Consequently, in a process of embedding the embedding film 34 into the groove 21 and the opening 33, it becomes possible to readily form the second separation layer 23 into the tapered and pointed shape that the width is gradually narrowed with distance from the first separation layer 22 after the shape of the overhang part 32A.

Examples of the material of the embedding film 34 may include metals such as tungsten (W), silver (Ag), aluminum (Al), Rh (rhodium) and so forth similarly to the above-mentioned first separation layer 22 and second separation layer 23. In addition, it is also possible to make the embedding film 34 of the material which is lower in refraction index than the material of the color filter 12 such as the Low-k film and so forth similarly to the above-mentioned first separation layer 22 and second separation layer 23. In both cases, the film deposition process is the same as the above.

Figure 7:
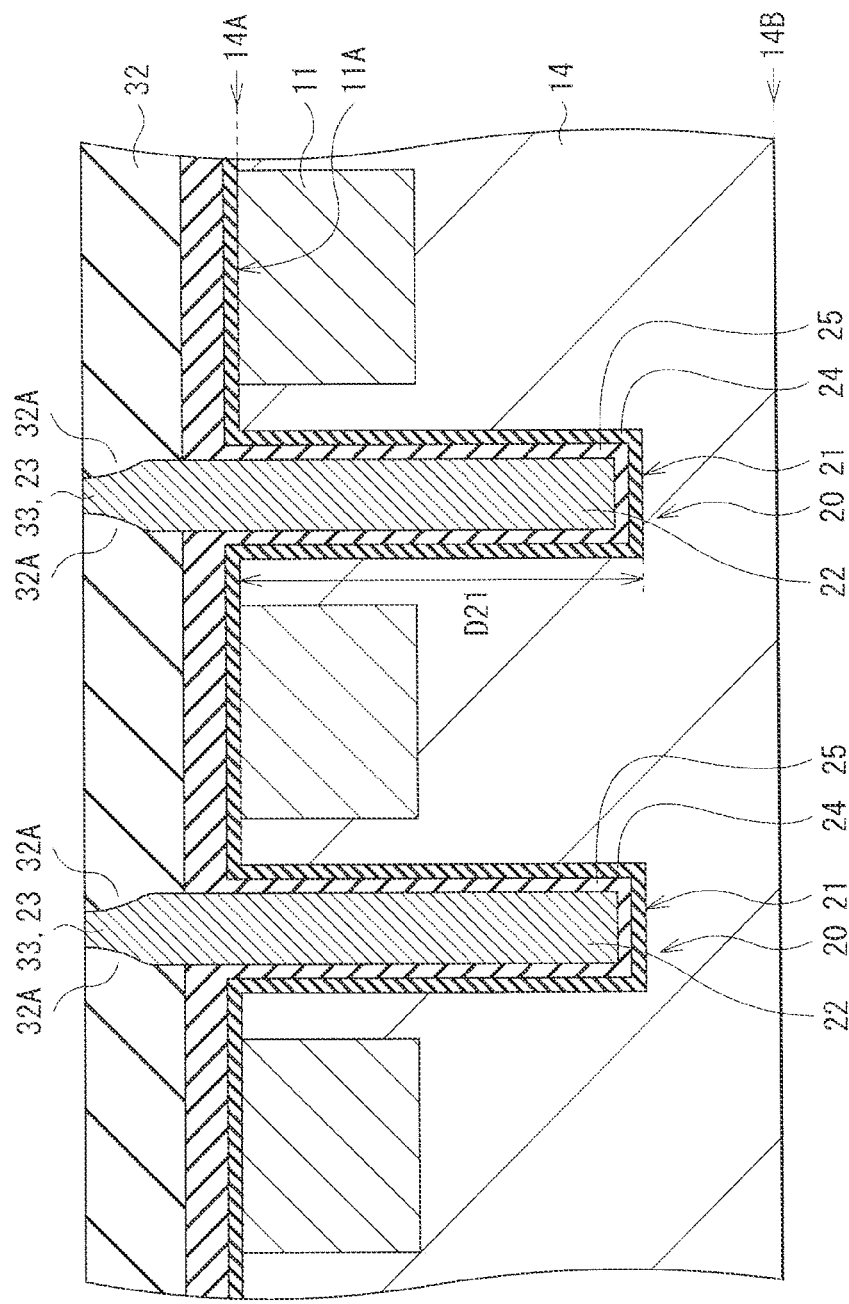
FIG. 7 is an illustrative sectional diagram showing a process following the process in FIG. 6.

After the embedding film 34 is deposited, a part of the embedding film 34 that is formed on the cover layer 32 may be removed, for example, by etching-back or CMP (Chemical Mechanical Polishing) as shown in FIG. 7.

Figure 8:
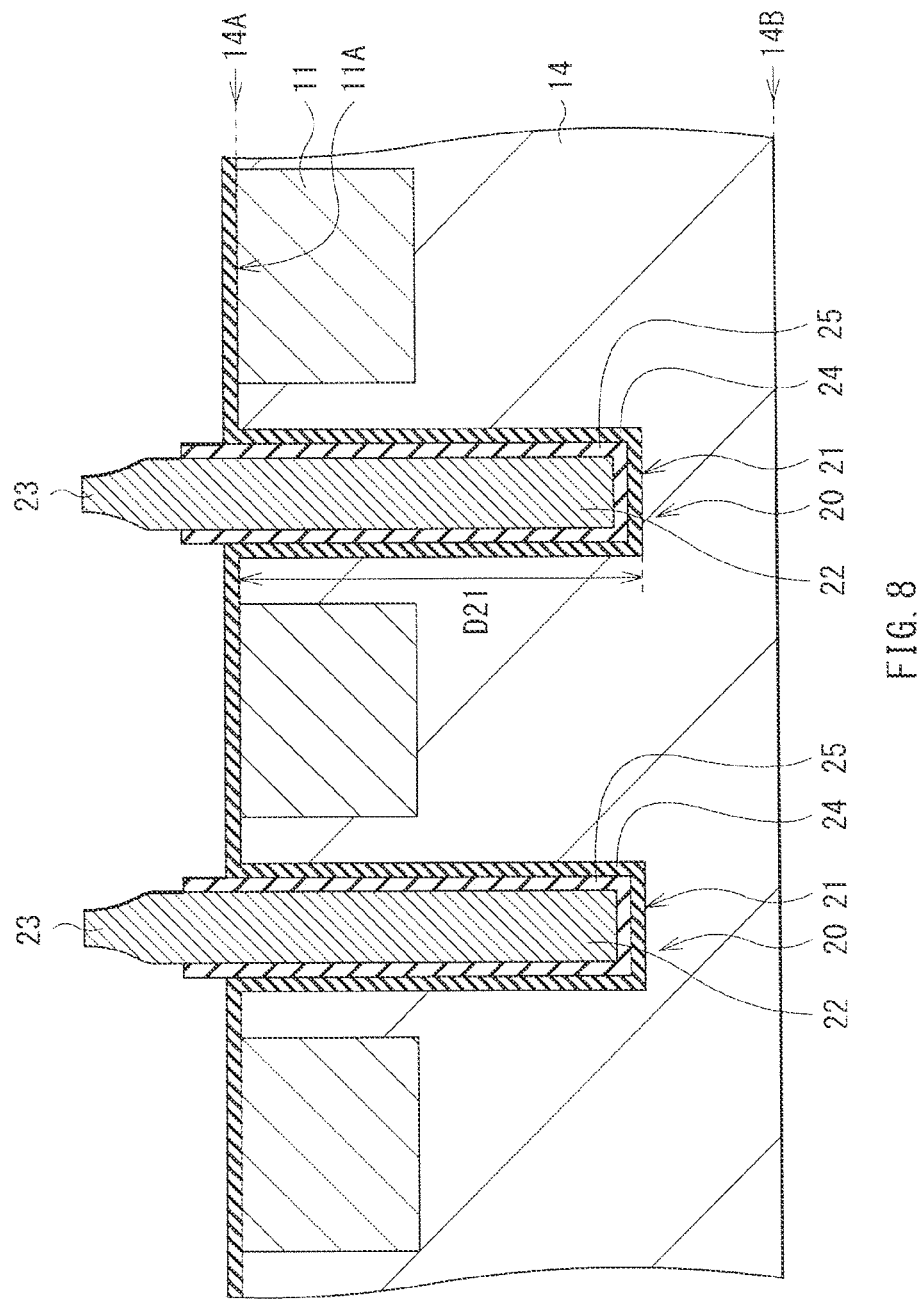
FIG. 8 is an illustrative sectional diagram showing a process following the process in FIG. 7.

Then, the cover layer 32 and the hard mask 31 are removed by a wetting process using hydrogen fluoride (Hf) as shown in FIG. 8. Consequently, the second separation layer 23 is brought into a state that it protrudes from the back surface 14A of the semiconductor substrate 14. At that time, the pinning film 24 is left on the back surface 14A of the semiconductor substrate 14.

Figure 9:
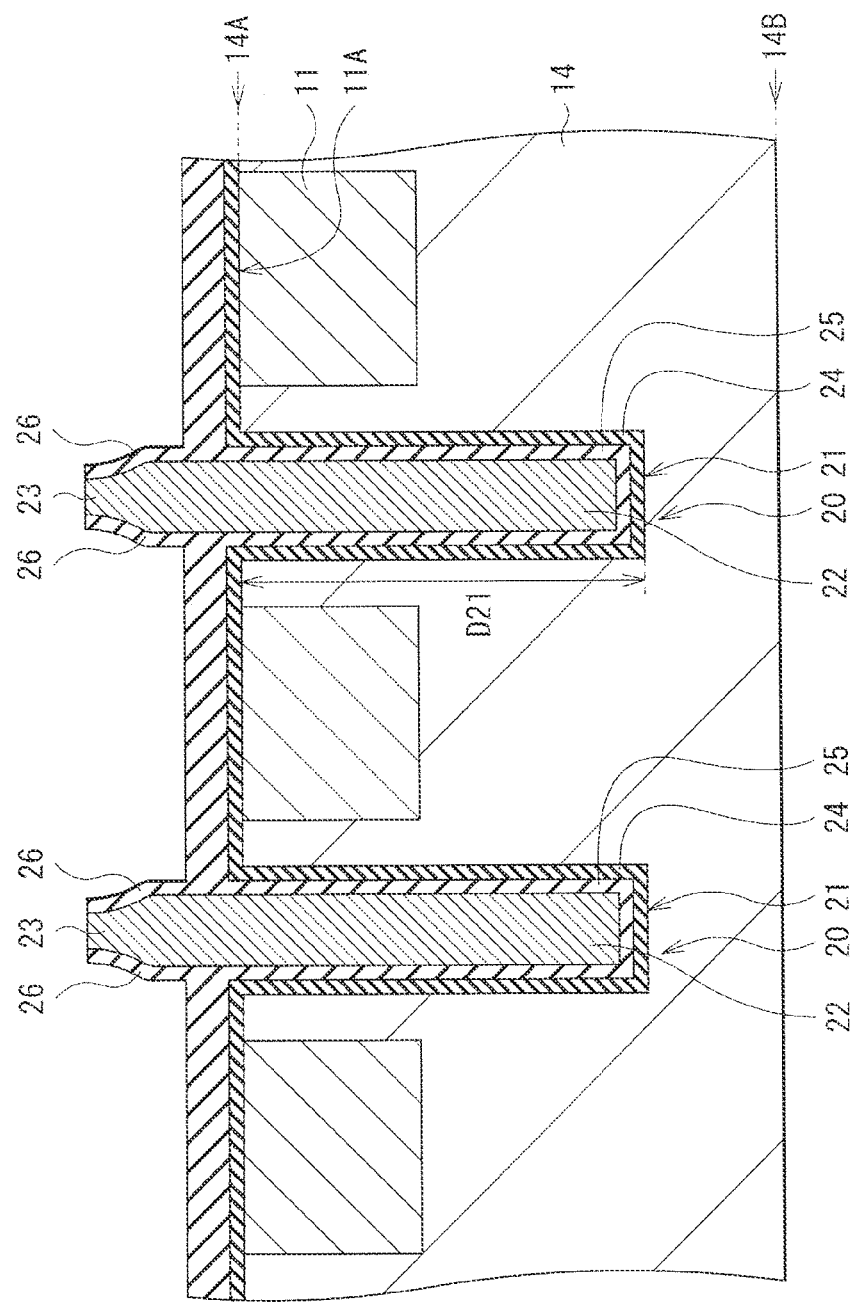
FIG. 9 is an illustrative sectional diagram showing a process following the process in FIG. 8.

Then, the antireflection film 26 is formed on an exposed surface of the second separation layer 23 as shown in FIG. 9.

Figure 10:
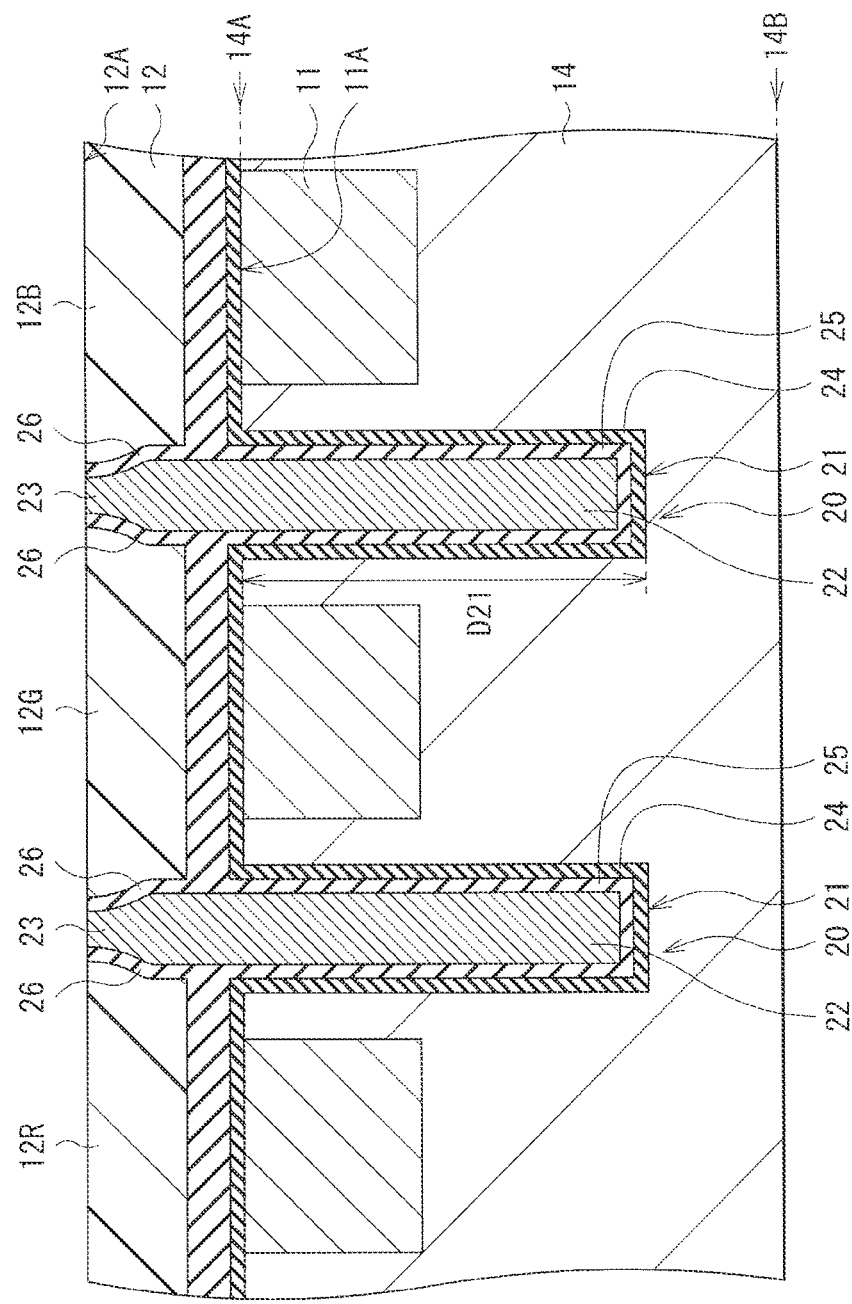
FIG. 10 is an illustrative sectional diagram showing a process following the process in FIG. 9.

After the antireflection film 26 is formed, the color filter 12 is formed in a region partitioned by the second separation layer 23 as shown in FIG. 10. Finally, the on-chip lens 13 is disposed on the color filter 12. Formation of the solid-state image pickup device 1 shown in FIG. 1 is completed through the above-mentioned processes.

Figure 11:
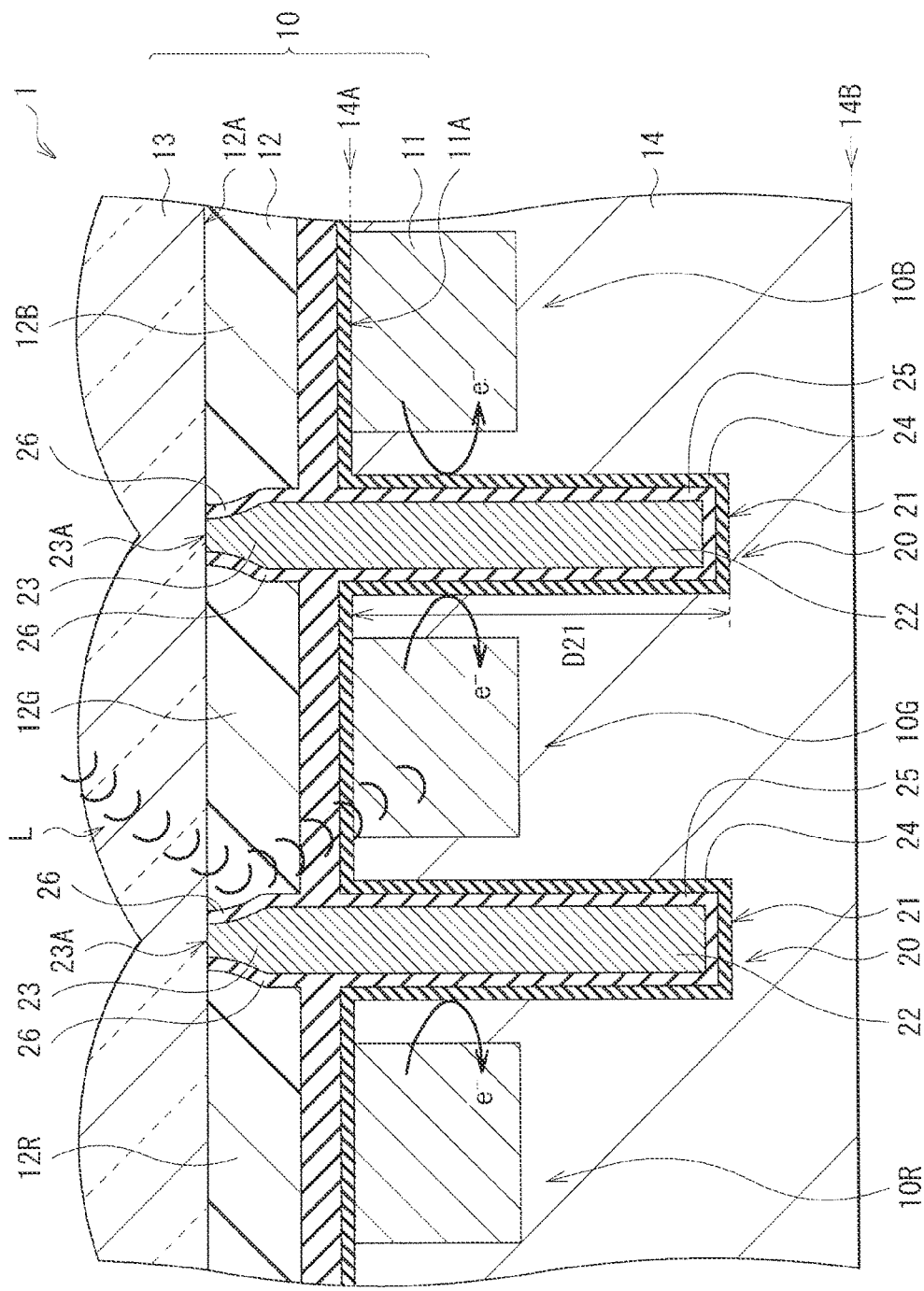
FIG. 11 an illustrative sectional diagram showing a functional example of the solid-state image pickup device shown in FIG. 1.

In the solid-state image pickup device 1, when light enters the photoelectric conversion element 11 via the on-chip lens 13, the light passes through the photoelectric conversion element 11 and is subjected to photoelectric conversion for every color light of red, green, and blue while passing through the photoelectric conversion element 11. Here, the separation structure 20 is provided along the boundary line between the pixels 10. The first separation layer 22 of the separation structure 20 is provided in the groove 21 along the boundary line between the photoelectric conversion elements 11. The groove 21 may be provided from the back surface 14A of the semiconductor substrate 14 down to the depth D21 corresponding to a wavelength or a range of wavelengths, or where photoelectric conversion of the specific color light such as, for example, green light occurs. Therefore, flowing of electrons $e^-$ generated in the photoelectric conversion element 11 of the pixel 10 concerned into the adjacent pixel 10 is suppressed and color mixing (intra-bulk color mixing) that occurs in the semiconductor substrate 14 is suppressed as illustrated in FIG. 11. In addition, the second separation layer 23 of the separation structure 20 is provided along a boundary line between the color filters 12, is formed integrally with the first separation layer 22, and is made of the same material as the first separation layer 22. Therefore, oblique incident light L is reflected by the second separation layer 23 and mixing of the oblique incident light L into the adjacent pixel 10 is suppressed, and therefore color mixing (upper layer color mixing) that occurs on the upper layer side (the color filter 12 side) situated above the back surface 14A (the light deceiving surface 11A) of the semiconductor substrate 14 is suppressed as also illustrated in FIG. 11.

In the solid-state image pickup device 1 of the present embodiment, the first separation layer 22 of the separation structure 20 is provided in the groove 21 along the boundary line between the photoelectric conversion elements 11 and the groove 21 is provided from the back surface 14A of the semiconductor substrate 14 down to the depth D21 corresponding to a wavelength or a range of wavelengths, or where photoelectric conversion of the specific color light occurs as described above. In addition, the second separation layer 23 of the separation structure 20 is provided integrally with the first separation layer 22 along the boundary line between the color filters 12 and is made of the same material as the first separation layer 22. Therefore, sure suppression of color mixing becomes possible by suppressing color mixing (intra-bulk color mixing) that occurs in the semiconductor substrate 14 by the first separation layer 22 and suppressing color mixing (upper layer color mixing) that occurs on the upper layer side (the color filter 12 side) situated above the back surface 14A (the light receiving surface 11A) of the semiconductor substrate 14 by the second separation layer 23.

Further, because the second separation layer 23 is formed into the tapered and pointed shape that the width is gradually narrowed with distance from the first separation layer 22, the tapered structure of the side face of the second separation layer 23 functions like the waveguide to make it possible to omit pupil correction of the on-chip lens 13.

In addition, in the present embodiment, after the groove 21 is provided from the back surface 14A of the semiconductor substrate 14, the cover layer 32 having the opening 33 that communicates with the groove 21 is formed on the back surface 14A side of the semiconductor substrate 14, and the first separation layer 22 and the second separation layer 23 are formed by embedding the embedding film 34 into the groove 21 and the opening 33. Therefore, it becomes easy to form the second separation layer 23 integrally with the first separation layer 22 and to make the second separation layer 23 of the same material as the first separation layer 22. In addition, it becomes possible to form the second separation layer 23 with high positional precision by self-alignment and it becomes possible to obtain characteristics that are not affected by production tolerance.

Further, in the process of forming the cover layer 32, the overhang part 32A is so formed on the end of the cover layer 32 as to narrow the inlet 33A of the opening 33. Thus, it becomes possible to readily form the second separation layer 23 into the tapered and pointed shape that the width is gradually narrowed with distance from the first separation layer 22 after the shape of the overhand part 32A.

Second Embodiment

Figure 12:
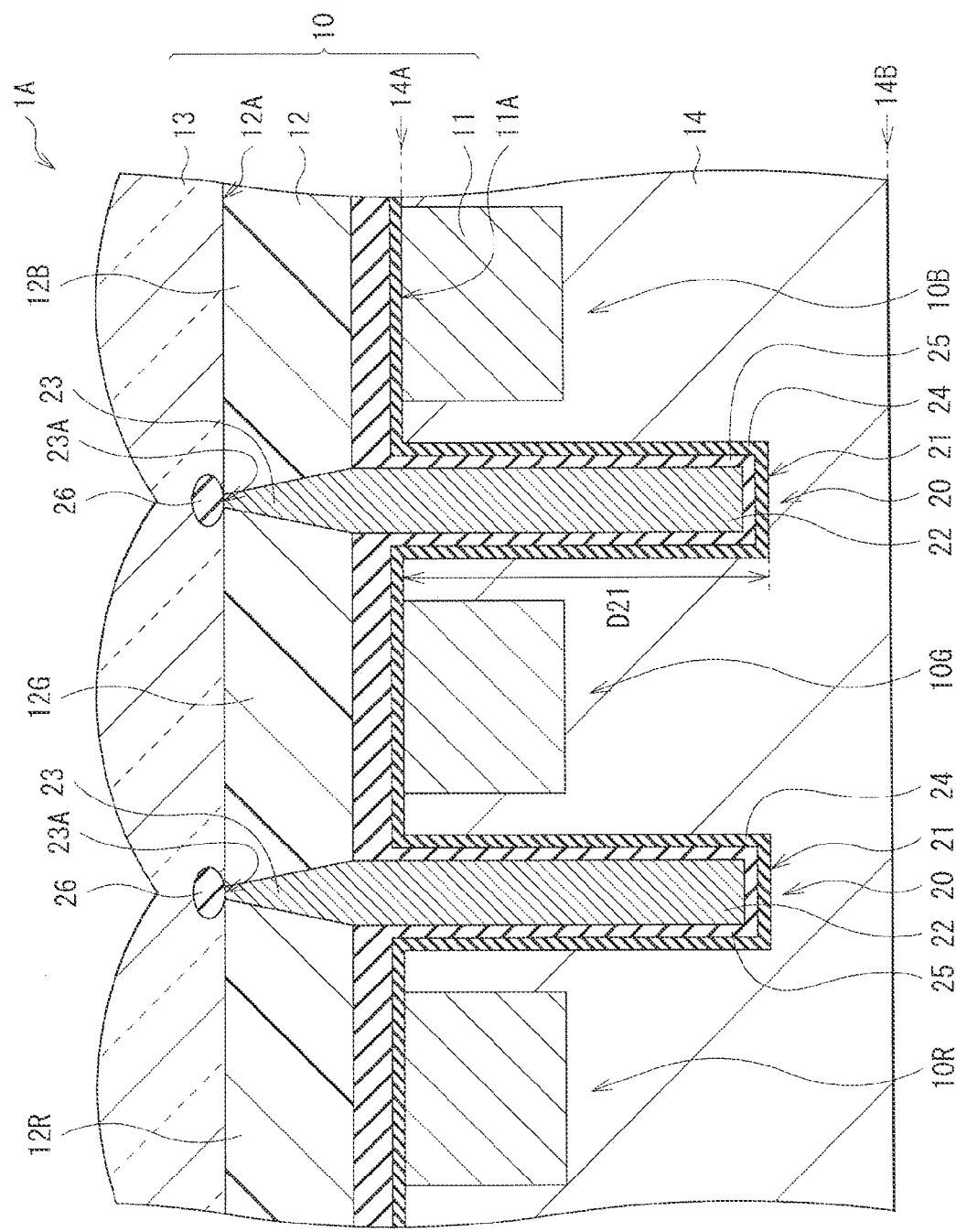
FIG. 12 is an illustrative sectional diagram showing a configuration example of a solid-state image pickup device pertaining to a second embodiment of the present disclosure.

FIG. 12 is an illustrative sectional diagram showing a configuration example of a solid-state image pickup device 1A pertaining to the second embodiment of the present disclosure. The present embodiment is configured such that the antireflection film 26 is so put on the upper surface 23A of the second separation layer 23 as to reflect light from outside by the upper surface 23A of the second separation layer 23, thereby suppressing incidence of reflected light upon the lens and so forth of the camera. The solid-state image pickup device 1A has the same configuration, function and effect as the solid-state image pickup device 1 pertaining to the above-mentioned first embodiment excepting the above-mentioned point.

The solid-state image pickup device 1A may be manufactured, for example, in the following manner.

Figure 13:
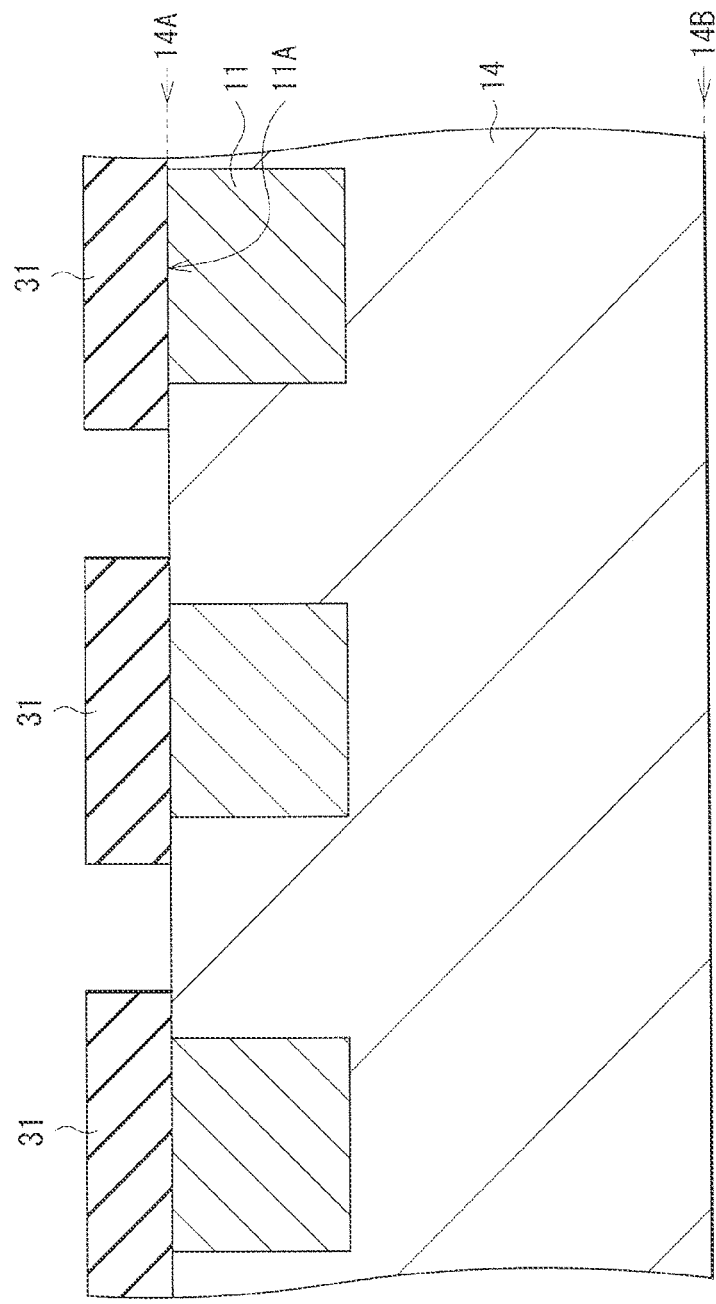
FIG. 13 is an illustrative sectional diagram showing an example of a method of manufacturing the solid-state image pickup device shown in FIG. 12 in order of the processes.

FIG. 13 to FIG. 19 are diagrams showing an illustrative example of a method of manufacturing the solid-state image pickup device 1A in order of processes. First, the photoelectric conversion element 11 is provided in the semiconductor substrate 14 and the back surface 14A of the semiconductor substrate 14 is polished to form the light receiving surface 11A of the photoelectric conversion element 11 as shown in FIG. 13.

Next, the hard mask 31 for trench machining is formed on the back surface 14A of the semiconductor substrate 14 as also shown in FIG. 13.

Figure 14:
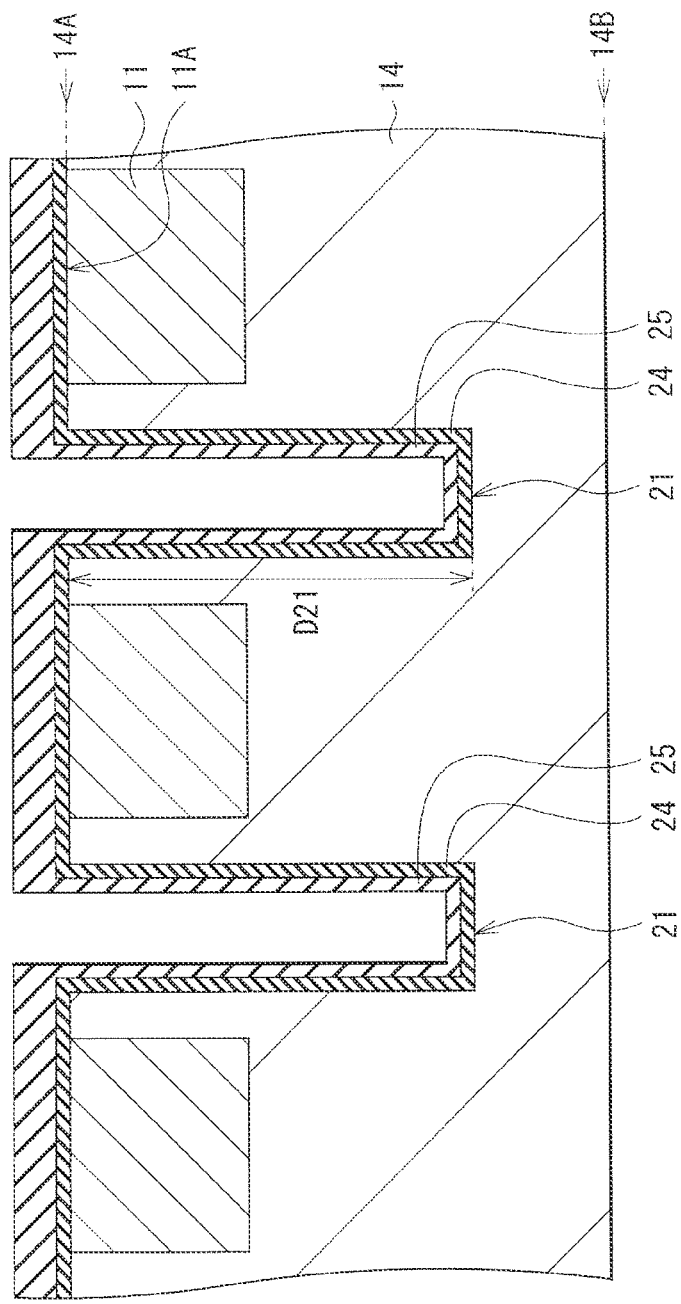
FIG. 14 is an illustrative sectional diagram showing a process following the processes in FIG. 13.

Then, the semiconductor substrate 14 is machined into a trench-like shape by using the hard mask 31 to form the groove 21 as shown in FIG. 14. The groove 21 may be provided from the back surface 14A of the semiconductor substrate 14 down to the depth D21 corresponding to a wavelength or a range of wavelengths, or where photoelectric conversion of the specific color light such as, for example, green light occurs along the boundary line between the photoelectric conversion elements 11.

Thereafter, the hard mask 31 is removed and the pinning film 24 made of $Ta_2O_5$, $HfO_2$, $Al_2O_3$, $TiO_2$ and so forth is deposited on the inner surface of the groove 21 and the back surface 14A of the semiconductor substrate 14 as also shown in FIG. 14. Then, the insulating film 25 made of $SiO_2$ and so forth may be formed to have a thickness of, for example, approximately 10 nm.

Figure 15:
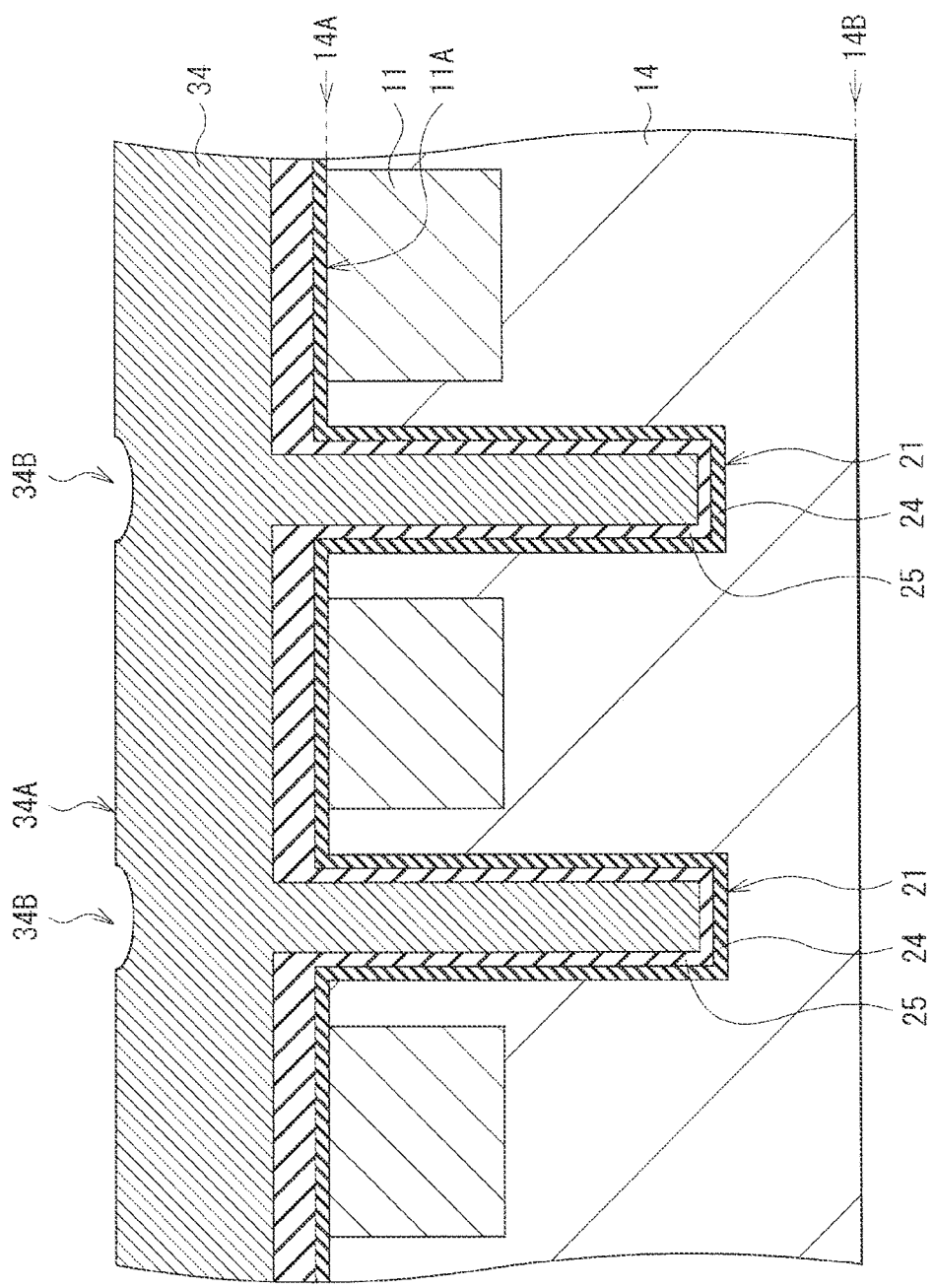
FIG. 15 is an illustrative sectional diagram showing a process following the process in FIG. 14.

Then, the embedding film 34 may be embedded into the groove 21 and the back surface 14A side of the semiconductor substrate 14 (the front surface of the insulating film 25) may be covered with the embedding film 34, for example, by the CVD method or the ALD method as shown in FIG. 15. At that time, a gently curved dent 34B is formed in an upper surface 34A of the embedding film 34 at a position facing the groove 21. For example, the dent 34B may have a thickness of approximately 50 nm to approximately 100 nm both inclusive and may have a depth of approximately 60 nm to approximately 70 nm both inclusive.

Examples of the material of the embedding film 34 may include metals such as tungsten (W), silver (Ag), aluminum (Al), Rh (rhodium) and so forth similarly to the above-mentioned first separation layer 22 and second separation layer 23. Alternatively, the embedding film 34 may be made of the material that is lower in refractive index than the material of the color filter 12 such as the Low-k film and so forth similarly to the above-mentioned first separation layer 22 and second separation layer 23. In both cases, the film deposition process is the same as the above.

Figure 16:
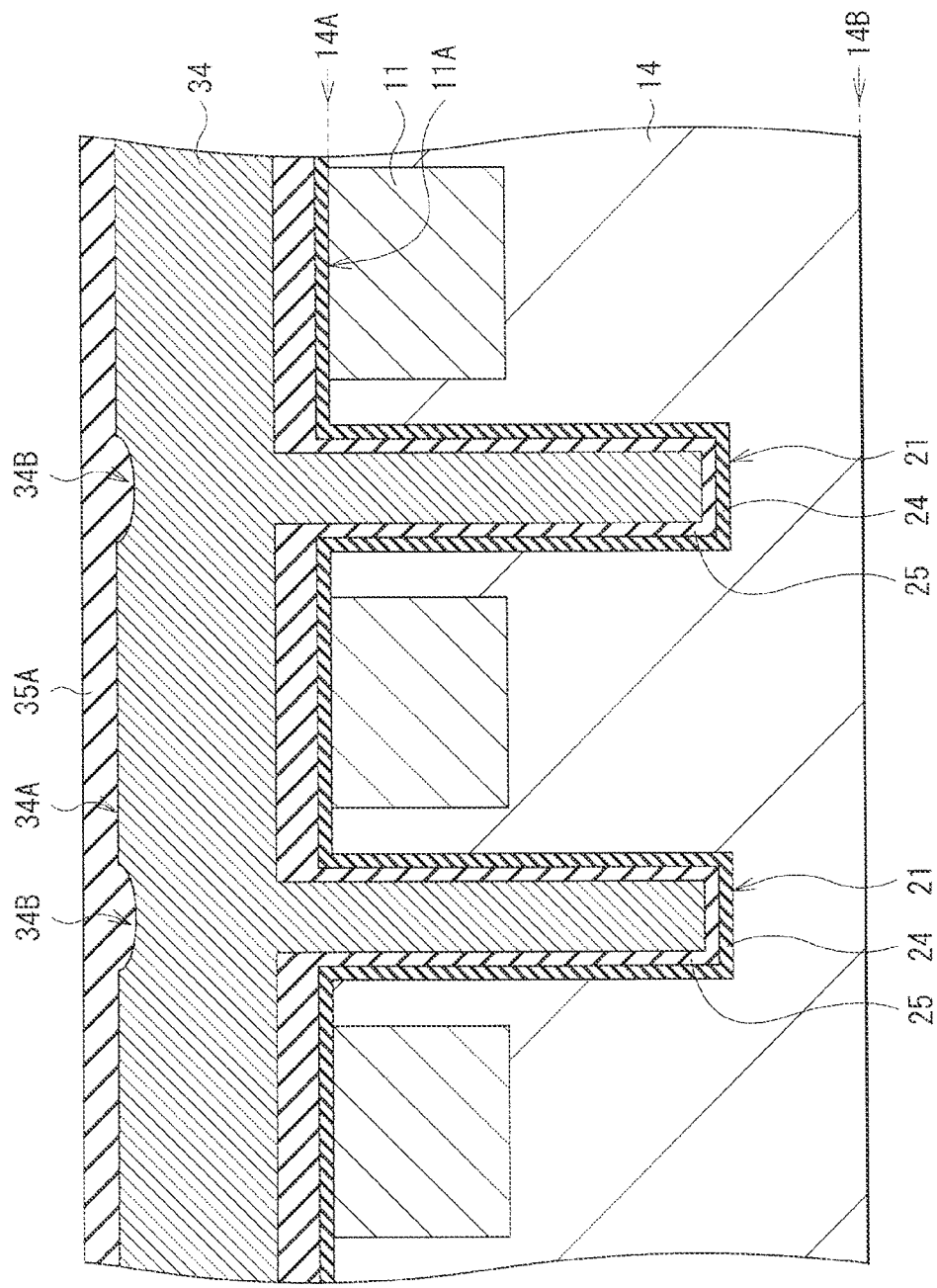
FIG. 16 is an illustrative sectional diagram showing a process following the process in FIG. 15.

After the embedding film 34 is deposited, a mask material layer 35A is formed on the upper surface 34A of the embedding film 34 as shown in FIG. 16. Examples of the material of the mask material layer 35A may include the barrier metal such as TiN and so forth and the silicon compounds such as SiN, SiON and so forth similarly to the material of the antireflection film 26.

Figure 17:
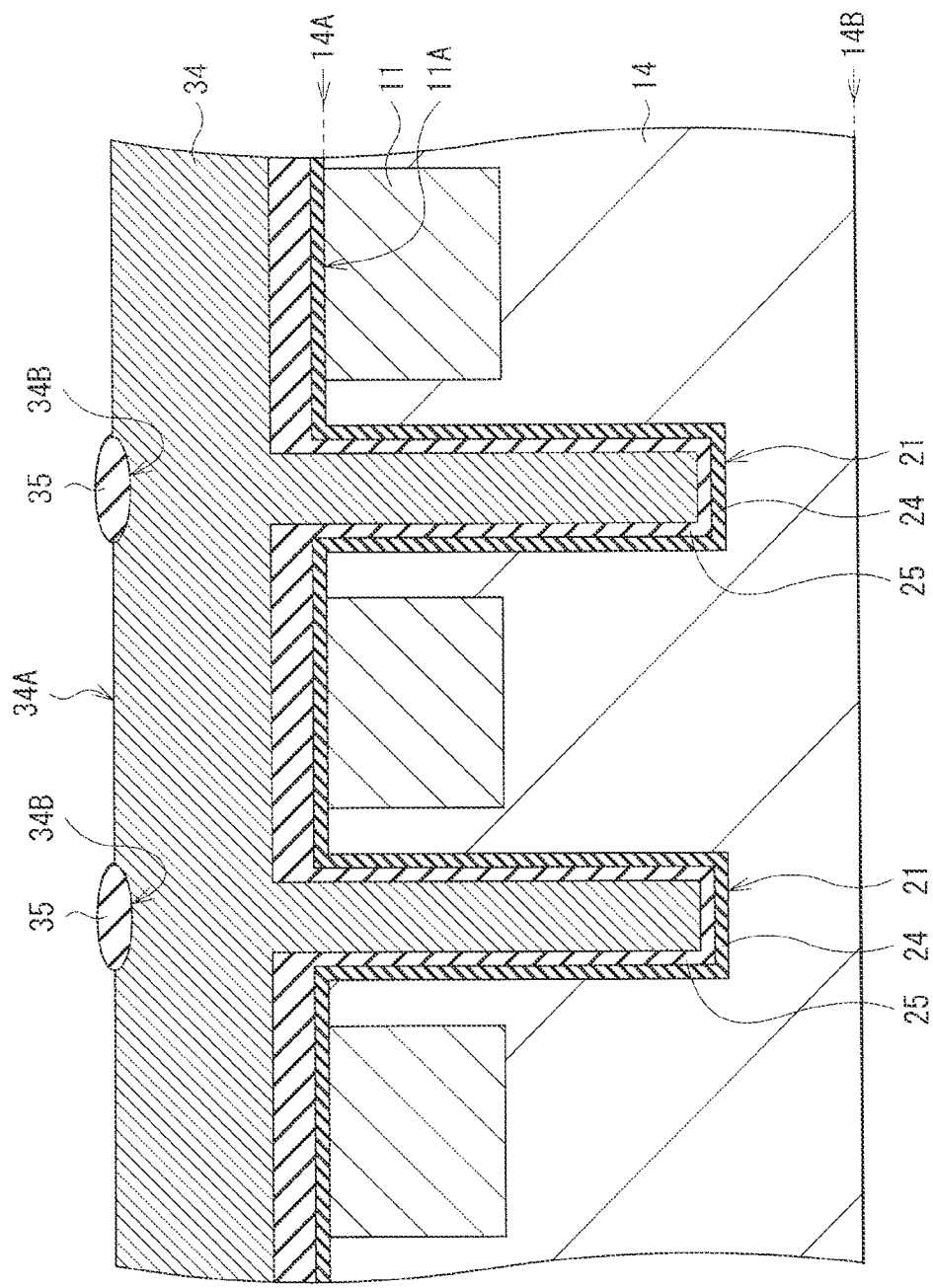
FIG. 17 is an illustrative sectional diagram showing a process following the process in FIG. 16.

When CMP polishing is performed on the embedding film 34 after formation of the mask material layer 35A, the mask material layer 35A is left in the dent 34B in the upper surface 34A of the embedding film 34. A mask layer 35 is formed on the upper surface 34A of the embedding film 34 at a position (in the dent 34B) facing the groove 21 in this way as shown in FIG. 17.

Figure 18:
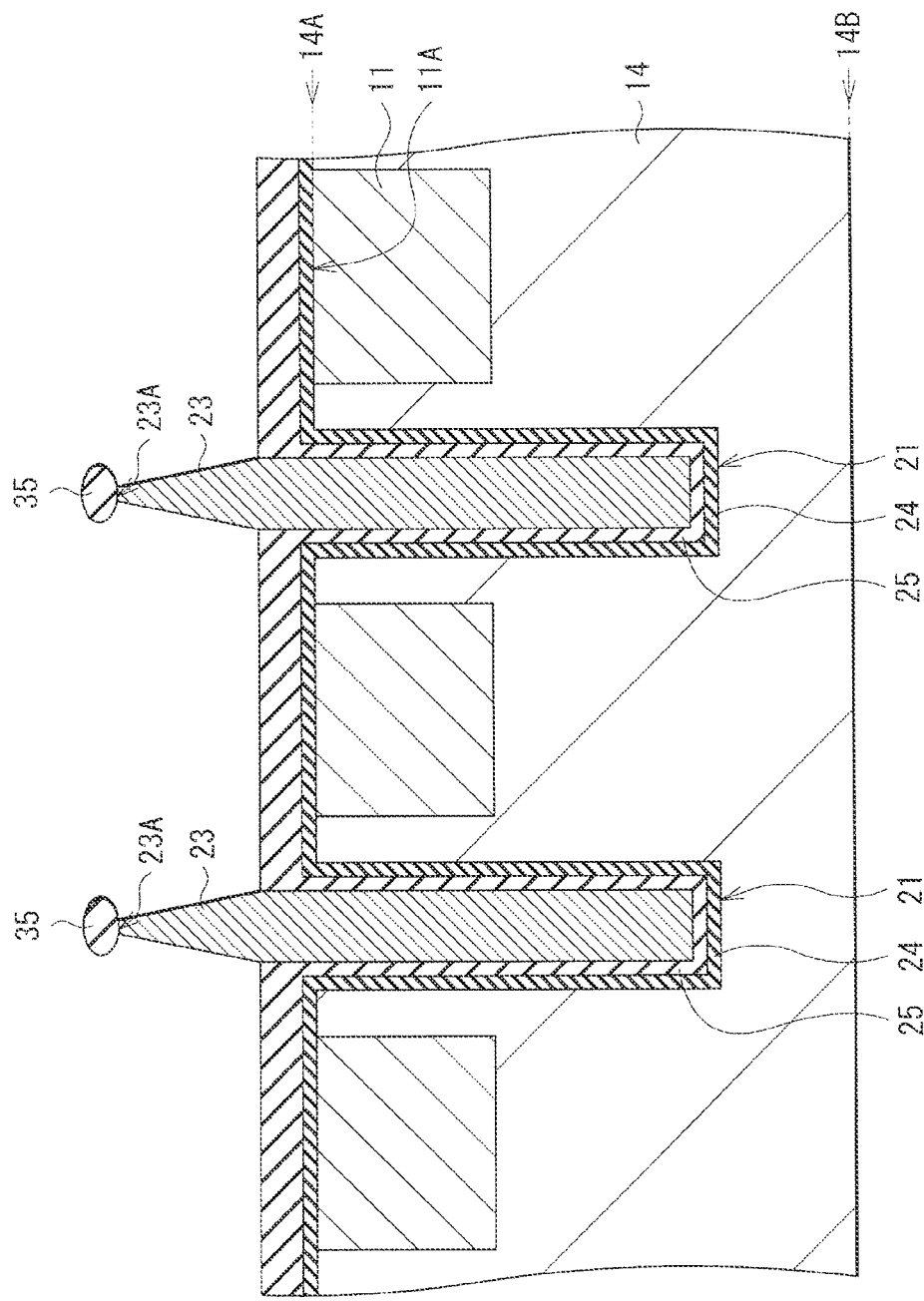
FIG. 18 is an illustrative sectional diagram showing a process following the process in FIG. 17.

When the embedding film 34 is etched back after formation of the mask layer 35, a part of the embedding film 34 that is not exposed from the mask layer 35 is removed. Thus, the first separation layer 22 is formed in the groove 21 and the second separation layer 23 is formed between the groove 21 and the mask layer 35 as shown in FIG. 18. The second separation layer 23 is formed integrally with the first separation layer 22 and is made of the same material as the first separation layer 22. The mask layer 35 is left on the upper surface 23A of the second separation layer 23.

In a process of etching back the embedding film 34, a part (a shallower part) of the embedding film 34 that is closer to the upper surface 34A thereof is longer in processing time and is larger in amount to be etched than other parts. Therefore, the second separation layer 23 is formed into the tapered and pointed shape that the width is gradually narrowed with distance from the first separation layer 22.

The mask layer 35 covers the upper surface 23A of the second separation layer 23. Therefore, it may be possible to make the mask layer 35 also serve as the antireflection film 26 by using, for example, the barrier metal such as TiN and so forth and the silicon compounds such as SiN, SiON and so forth as the material of the mask layer 35 similarly to the material of the antireflection film 26.

Figure 19:
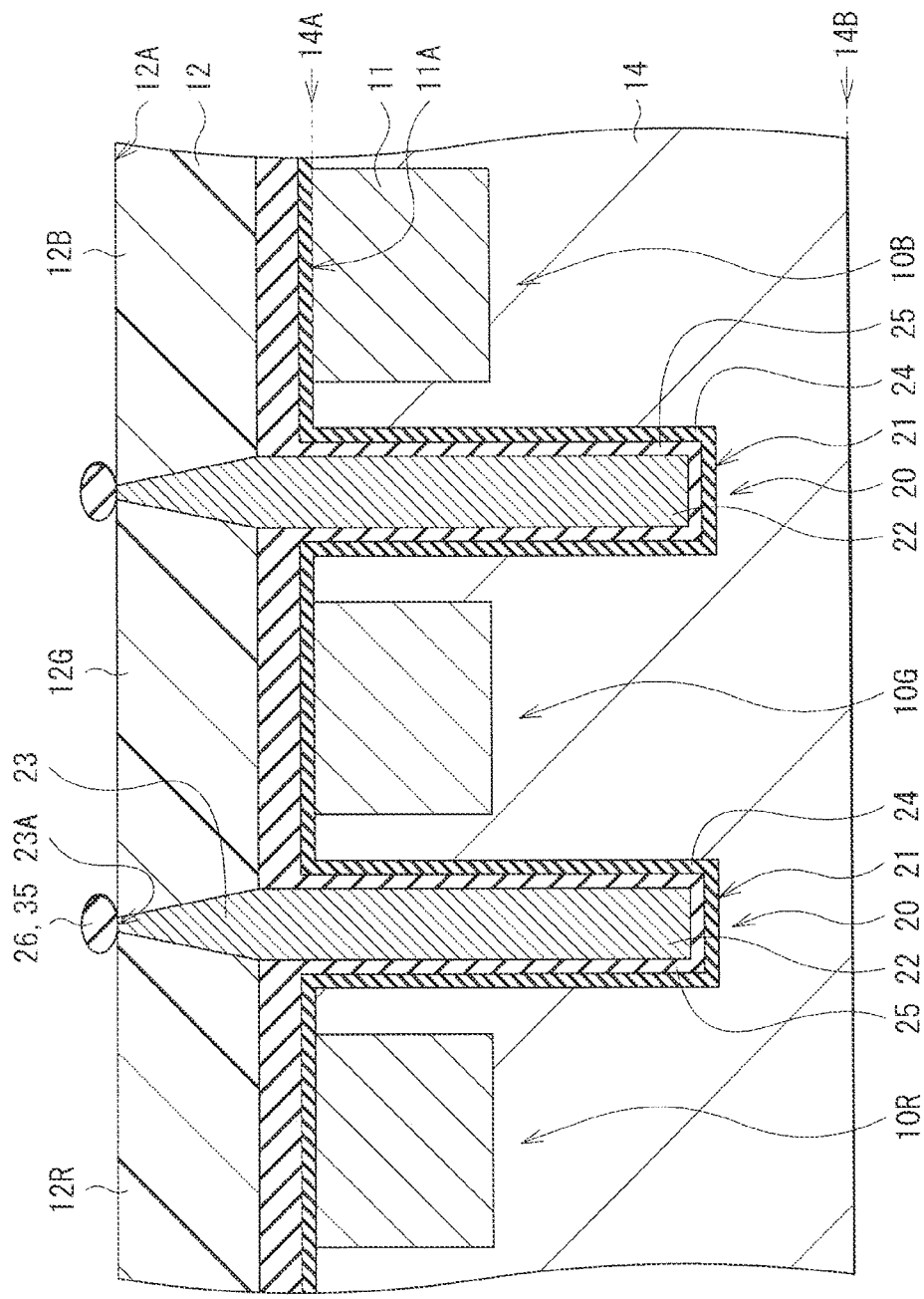
FIG. 19 is an illustrative sectional diagram showing a process following the process in FIG. 18.

Thereafter, the color filter 12 is formed in a region that is partitioned by the second separation layers 23 as shown in FIG. 19. Finally, the on-chip lens 13 is disposed on the color filter 12. Formation of the solid-state image pickup device 1A shown in FIG. 12 is completed through the above-mentioned processes.

In the present embodiment, after the groove 21 is formed from the back surface 14A of the semiconductor substrate 14, the embedding film 34 is embedded into the groove 21 and the back surface 14A side of the semiconductor substrate 14 is covered with the embedding film 34, and then the mask layer 35 is formed on the upper surface 34A of the embedding film 34 at the position facing the groove 21. Thereafter, the first separation layer 22 is formed in the groove 21 and the second separation layer 23 is formed between the groove 21 and the mask layer 35 by etching back the embedding film 34. Accordingly, it becomes easy to form the second separation layer 23 integrally with the first separation layer 22 and to make the second separation layer 23 of the same material as the first separation layer, 22. In addition, it becomes possible to form the second separation layer 23 with high positional precision by self-alignment and it becomes possible to obtain characteristics that are not affected by production tolerance.

In addition, in the process of etching back the embedding film 34, because the mask layer 35 is disposed to cover the upper surface 23A of the second separation layer 23, it becomes possible to make the mask layer 35 also serve as the antireflection film 26.

Further, in the process of etching back the embedding film 34, because the second separation layer 23 is formed into the tapered and pointed shape that the width is gradually narrowed with distance from the first separation layer 22, the tapered structure of the side face of the second separation layer 23 functions like the waveguide to make it possible to omit pupil correction of the on-chip lens 13.

(General Configuration of Solid-State Image Pickup Device)

Figure 20:
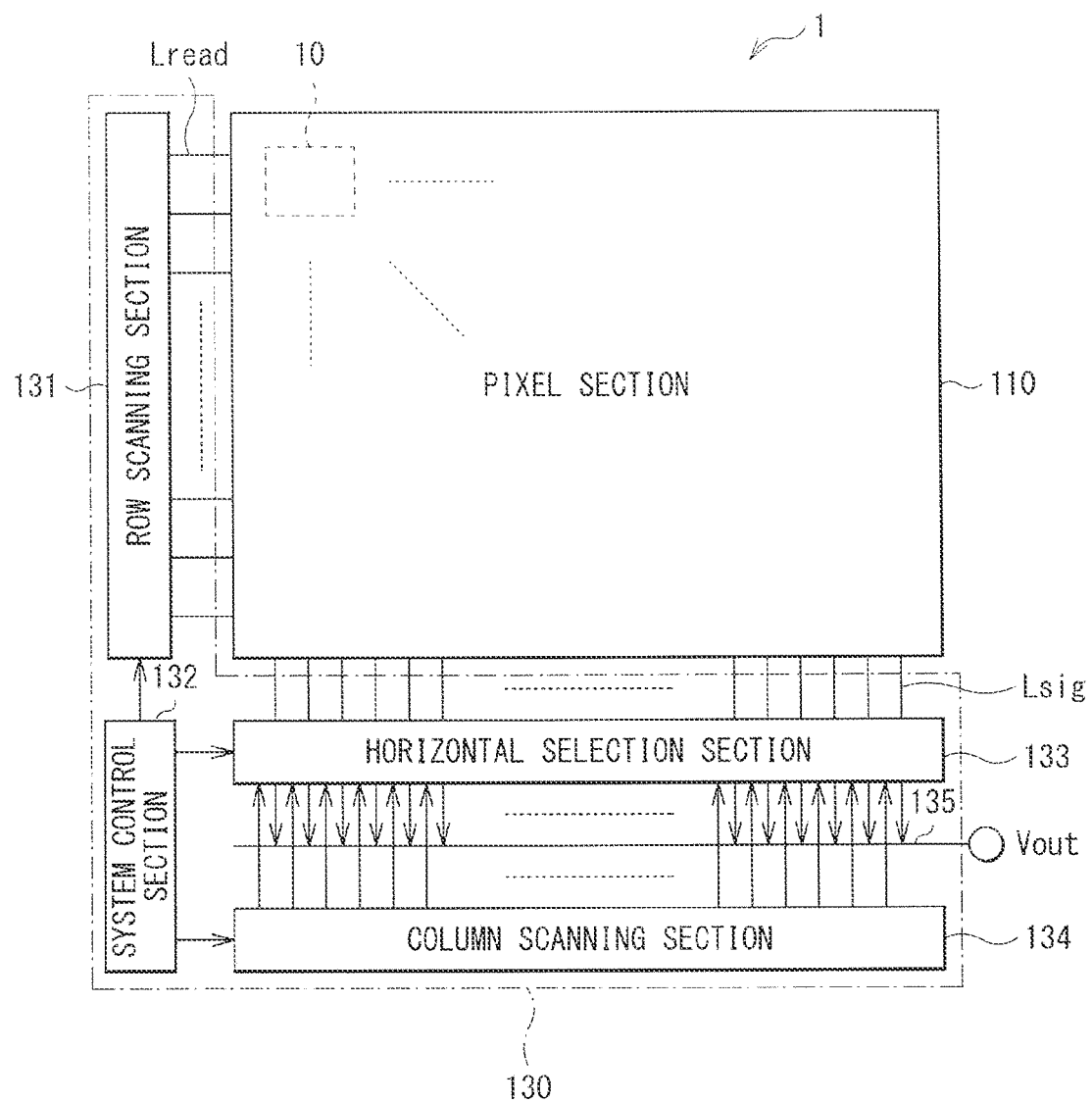
FIG. 20 is an illustrative functional block diagram showing a general configuration example of the solid-state image pickup device shown in FIG. 1 or FIG. 12.

FIG. 20 is a functional block diagram illustrating a general configuration example of the solid-state image pickup device 1 (1A) described in the above-mentioned embodiment. The solid-state image pickup device 1 (1A) may include the pixel section 110 as an image pickup pixel region and a circuit section 130 including, for example, a row scanning section 131, a horizontal selection section 133, a column scanning section 134, and a system control section 132. The circuit section 130 may be either provided in a peripheral region of the pixel section 110 or provided (in a region facing the pixel section 110) by being laminated with the pixel section 110.

The pixel section 110 may include, for example, the plurality of pixels 10 that are two-dimensionally arranged in a matrix. For example, a pixel drive line Lread (specifically, a row selection line and a reset control line) may be wired to the pixels 10 for every pixel row and a vertical signal line Lsig may be wired to the pixels 10 for every pixel column. The pixel drive line Lread is adapted to transmit a drive signal for reading out a signal from the pixel concerned. One end of each pixel drive line Lread is connected to each output end of the row scanning section 131 corresponding to each row of pixels.

The row scanning section 131 may be a pixel drive section that is configured by a shift register, an address decoder and so forth to drive each pixel 10 of the pixel section 110, for example, in units of rows. Signals output from the respective pixels 10 in the pixel row that has been selectively scanned by the row scanning section 131 are supplied to the horizontal selection section 133 via the respective vertical signal lines Lsig. The horizontal selection section 133 is configured by an amplifier, a horizontal selection switch and so forth that are provided for every vertical signal line Lsig.

The column scanning section 134 is configured by a shift register, an address decoder and so forth to drive the respective horizontal selection switches of the horizontal selection section 133 in order while scanning them. The signals that are transmitted from the respective pixels 10 via the respective vertical signal lines Lsig are supplied to horizontal signal lines 135 in order and are output via the horizontal signal lines 135 concerned.

The system control section 132 is adapted to receive a clock signal applied from the outside and data and so forth for instructing an operation mode and to output data such as internal information and so forth of the solid-state image pickup device 1 (1A). The system control section 132 also includes timing generators that generate various timing signals and controls driving of the row scanning section 131, the horizontal selection section 133, the column scanning section 134 and so forth on the basis of the various timing signals generated by the timing generators concerned.

Application Example

Figure 21:
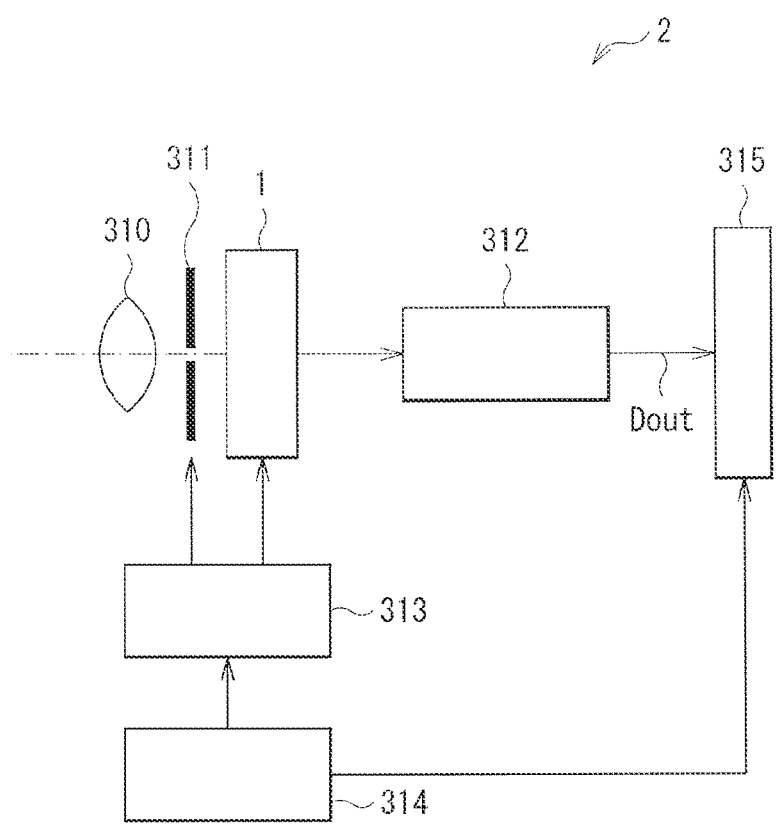
FIG. 21 is an illustrative functional block diagram showing a schematic configuration example of an electronic apparatus pertaining to an application example.

The solid-state image pickup device 1 (1A) pertaining to the above-mentioned embodiment may be applicable to all types of electronic apparatuses having the image picking-up function including, for example, camera systems such as digital still cameras, video cameras and so forth, mobile phones having the image picking-up function and so forth. FIG. 21 is a diagram showing a schematic configuration example of an electronic apparatus 2 (a camera) as an example thereof. The electronic apparatus 2 may be a video camera adapted, for example, to take a still image and/or to capture a moving image and may include, for example, the solid-state image pickup device 1 (1A), an optical system (an image pickup lens) 310, a shutter device 311, a drive section 313 (including the above-mentioned circuit section 130) that drives the solid-state image pickup device 1 (1A) and the shutter device 311, a signal processing section 312, a user interface 314, and a monitor 315.

The optical system 310 is adapted to guide image light (incident light) from an object to the pixel section 110 of the solid-state image pickup device 1 (1A). This optical system 310 may be configured by a plurality of optical lenses. The shutter device 311 is adapted to control a light application period and a shading period for the solid-state image pickup device 1 (1A). The drive section 313 is adapted to control a transfer operation of the solid-state image pickup device 1 (1A) and a shutter operation of the shutter device 311. The signal processing section 312 is adapted to perform various kinds of signal processing on the signal output from the solid-state image pickup device 1 (1A). An image signal Dout after subjected to the signal processing is output onto the monitor 315. Alternatively, the image signal Dout may be stored in a memory medium such as a memory and so forth. In the user interface 314, designation of a photographing scene (designation of the dynamic range, designation of the wavelength of light (terahertz rays, visible rays, infrared rays, ultraviolet rays, X-rays and so forth)) and so forth are possible, and the designation (an input signal input through the user interface 314) is sent to the drive section 313 and desired image picking-up is performed by the solid-state image pickup device 1 (1A) on the basis of the input signal.

Although the present disclosure has been described by giving the embodiments, the present disclosure is not limited to the above-mentioned embodiments and may be modified in a variety of ways. Although, for example, in the above-mentioned embodiments, description has been made by specifically giving the configurations of the solid-state image pickup devices 1 and 1A, it is not necessary to include all of the constitutional elements described in the above-mentioned embodiments and an element or elements other than the above-mentioned elements may be also included.

In addition, the materials and thicknesses of the respective layers and/or the film deposition methods and film deposition conditions and so forth of the respective layers that have been described in the above-mentioned embodiments are not determinative and other materials and thicknesses may be adopted and/or other film deposition methods and film deposition conditions may be adopted.

It is possible to achieve at least the following illustrative configurations from the above-described example embodiments of the disclosure.

[1] A solid-state image pickup device, including: a plurality of pixels; a separation structure provided along a boundary line adjacent to the plurality of pixels; the separation structure includes a groove provided from a back surface of the semiconductor substrate to a depth corresponding to a wavelength, the groove being positioned along the boundary line, a first separation layer provided in the groove, and a second separation layer provided above the first separation layer and corresponding to the boundary line, the second separation layer being connected to the first separation layer.

[2] The solid-state image pickup device according to 1, where the second separation layer has a tapered shape such that a width of the second separation layer decreases as a distance from the first separation layer increases.

[3] The solid-state image pickup device according to 2, where a side of the tapered shape of the second separation layer reflects light such that the light condenses before the light contacts a light receiving surface of a photoelectric conversion element in the pixel that is adjacent to the side of the tapered shape of the second separation layer.

[4] The solid-state image pickup device according to 2, further including an anti-reflection layer provided on the back surface of the semiconductor substrate and extending into the groove such that the anti-reflection layer is in contact with side surfaces and a lower surface of the first separation layer.

[5] The solid-state image pickup device according to 4, where the anti-reflection layer is in contact with side surfaces of the second separation layer.

[6] The solid-state image pickup device according to 5, where each pixel further includes a color filter arranged on the back surface side of the semiconductor substrate so as to face the photoelectric conversion element, and the separation structure is provided adjacent to the color filter.

[7] The solid-state image pickup device according to 6, where an upper surface of the second separation layer is at a same height as a light incident surface of the color filters that are adjacent to the second separation layer.

[8] The solid-state image pickup device according to 6, where an upper surface of the second separation layer is higher than a light incident surface of the color filters that are adjacent to the second separation layer.

[9] The solid-state image pickup device according to 6, where the anti-reflection layer extends to an upper surface of the second separation layer, and where an upper surface of the second separation layer is higher than a light incident surface of the color filters that are adjacent to the second separation layer.

[10] The solid-state image pickup device according to 2, where the second separation layer is made of the same material as the first separation layer.

[11] The solid-state image pickup device according to 6, where a refractive index of the second separation layer is lower than a refractive index of the color filters that are adjacent to the second separation layer.

[12] The solid-state image pickup device according to 1, further including a film having a negative fixed charge and an insulating film each provided between the groove and the first separation layer.

[13] A method of manufacturing a solid-state image pickup device, the method including: providing a plurality of pixels; providing a groove from a back surface of a semiconductor substrate down to a depth corresponding to a wavelength, the groove being positioned along a boundary line adjacent to the plurality of pixels; forming a cover layer on the back surface of the semiconductor substrate, the cover layer having an opening corresponding to the groove; forming a first separation layer in the groove and forming a second separation layer in the opening by embedding an embedding film into the groove, the opening, and at least a portion of the cover layer, where the second separation layer is connected to the first separation layer; removing the embedding film that is formed on the portion of the cover layer; and removing the cover layer.

[14] The method of manufacturing a solid-state image pickup device according to 13, where the second separation layer has a tapered shape such that a width of the second separation layer decreases as a distance from the first separation layer increases.

[15] The method of manufacturing a solid-state image pickup device according to 14, where a side of the tapered shape of the second separation layer reflects light such that the light condenses before the light contacts a light receiving surface of a photoelectric conversion element in the pixel that is adjacent to the side of the tapered shape of the second separation layer.

[16] The method of manufacturing a solid-state image pickup device according to 14, further including an anti-reflection layer provided on the back surface of the semiconductor substrate and extending into the groove such that the anti-reflection layer is in contact with side surfaces and a lower surface of the first separation layer.

[17] The method of manufacturing a solid-state image pickup device according to 16, where the anti-reflection layer is in contact with side surfaces of the second separation layer.

[18] The method of manufacturing a solid-state image pickup device according to 17, where each pixel further includes a color filter arranged on the back surface side of the semiconductor substrate so as to face a photoelectric conversion element, and the separation structure is provided adjacent to the color filter.

[19] A method of manufacturing a solid-state image pickup device, the method including: providing a plurality of pixels; providing a groove from a back surface of a semiconductor substrate to a depth corresponding to a wavelength, the groove being positioned along a boundary line adjacent to the plurality of pixels; embedding an embedding film into the groove and covering the back surface of the semiconductor substrate with the embedding film; forming a mask material layer on an upper surface of the embedding film; polishing the mask material layer to form a mask layer on the upper surface of the embedding film at a position facing the groove; forming a first separation layer in the groove and a second separation layer between the groove and the mask layer by etching back the embedding film, the second separation layer being connected to the first separation layer.

[20] An electronic apparatus including the solid-state image-pickup device according to 1.

Further, it is possible to achieve at least the following configurations from the above-described example embodiments of the disclosure.

(1) A solid-state image pickup device, including:
pixels; and
a separation structure provided along a boundary line between the pixels, wherein
the pixels each includes
a photoelectric conversion element provided in a semiconductor substrate, and
a color filter so arranged on a back surface side of the semiconductor substrate as to face the photoelectric conversion element, and
the separation structure includes
a groove provided from a back surface of the semiconductor substrate down to a depth where photoelectric conversion of specific color light occurs along a boundary line between the photoelectric conversion elements,
a first separation layer provided in the groove, and
a second separation layer provided along a boundary line between the color filters, integrated with the first separation layer, and made of the same material as the first separation layer.

(2) The solid-state image pickup device according to (1), wherein
the specific color light is green light.

(3) The solid-state image pickup device according to (1) or (2), wherein
the first separation layer and the second separation layer are made of metal.

(4) The solid-state image pickup device according to (1) or (2), wherein the first separation layer and the second separation layer are made of a material that is lower in refractive index than a material of a color filter.

(5) The solid-state image pickup device according to any one of (1) to (4), wherein an upper surface of the second separation layer is on a level with a light incident surface of the color filter or is situated at a position higher than the light incident surface of the color filter.

(6) The solid-state image pickup device according to any one of (1) to (5), further including an antireflection film that is provided on an upper surface of the second separation layer.

(7) The solid-state image pickup device according to any one of (1) to (6), wherein the second separation layer has a tapered and pointed shape that has a width gradually narrowed with distance from the first separation layer.

(8) The solid-state image pickup device according to any one of (1) to (7), further including a pinning film that is provided on an inner surface of the groove.

(9) A method of manufacturing a solid-state image pickup device, including:

providing a photoelectric conversion element in a semiconductor substrate and providing a groove from a back surface of the semiconductor substrate down to a depth where photoelectric conversion of specific color light occurs along a boundary line between the photoelectric conversion elements;

forming a cover layer on a back surface side of the semiconductor substrate and providing an opening that communicates with the groove in the cover layer;

forming a first separation layer in the groove and forming a second separation layer in the opening by embedding an embedding film into the groove and the opening, forming the second separation layer integrally with the first separation layer, and making the second separation layer of the same material as the first separation layer;

removing a part of the embedding film that is formed on the cover layer;

removing the cover layer; and forming a color filter in a region that is partitioned by the second separation layer.

(10) The method of manufacturing a solid-state image pickup device according to (9), wherein in forming the cover layer, an overhang part that narrows an inlet of the groove is formed on an end of the cover layer, and in embedding the embedding film into the groove and the opening, the second separation layer is formed into a tapered and pointed shape that has a width gradually narrowed with distance from the first separation layer after the shape of the overhang part.

(11) A method of manufacturing a solid-state image pickup device, including providing a photoelectric conversion element in a semiconductor substrate and providing a groove from a back surface of the semiconductor substrate down to a depth where photoelectric conversion of specific color light occurs along a boundary line between the photoelectric conversion elements;

embedding an embedding film into the groove and covering a back surface side of the semiconductor substrate with the embedding film;

forming a mask material layer on an upper surface of the embedding film and forming a mask layer on the upper surface of the embedding film at a position facing the groove by polishing the mask material layer;

forming a first separation layer in the groove and forming a second separation layer between the groove and the mask layer by etching back the embedding film, and forming the second separation layer integrally with the first separation layer and making the second separation layer of the same material as the first separation layer; and forming a color filter in a region partitioned by the second separation layer.

(12) The method of manufacturing a solid-state image pickup device according to (11), wherein in etching back the embedding film, the mask layer is so disposed as to cover an upper surface of the second separation layer.

(13) The method of manufacturing a solid-state image pickup device according to (12), wherein the mask layer is so disposed as to also serve as an antireflection film.

(14) The method of manufacturing a solid-state image pickup device according to any one of (11) to (13), wherein in etching back the embedding film, the second separation layer is formed into a tapered and pointed shape that has a width gradually narrowed with distance from the first separation layer.

(15) An electronic apparatus, including a solid-state image pickup device, wherein the solid-state image pickup device includes pixels, and a separation structure provided along a boundary line between the pixels, the pixels each includes a photoelectric conversion element provided in a semiconductor substrate, and a color filter so arranged on a back surface side of the semiconductor substrate as to face the photoelectric conversion element, and the separation structure includes a groove provided from a back surface of the semiconductor substrate down to a depth where photoelectric conversion of specific color light occurs along a boundary line between the photoelectric conversion elements, a first separation layer provided in the groove, and a second separation layer provided along a boundary line between the color filter, formed integrally with the first separation layer, and made of the same material as the first separation layer.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup device, comprising:
  a plurality of pixels;
  a plurality of color filters, wherein at least some of the pixels are each associated with a color filter;
  a separation structure provided adjacent to the plurality of pixels,
  wherein the separation structure includes:
    a groove that extends from a back surface of a semiconductor substrate to a depth corresponding to a wavelength;
    a first separation layer provided in the groove;
    a second separation layer provided above the first separation layer, wherein the second separation layer is connected and integral to the first separation layer, wherein the second separation layer is outside of the groove, and wherein the second separation layer extends beyond the back surface of the semiconductor substrate to an area between two adjacent color filters, and an anti-reflection film provided on the back surface of the semiconductor substrate and extending into the groove such that the anti-reflection film is in contact with side surfaces and a lower surface of the first separation layer, wherein the anti-reflection film is in contact with side surfaces of the second separation layer, and wherein the anti-reflection film does not extend across an upper surface of the second separation layer.

2. The image pickup device according to claim 1, wherein the second separation layer has a tapered shape such that a width of the second separation layer decreases as a distance from the first separation layer increases.

3. The image pickup device according to claim 2, wherein a side of the tapered shape of the second separation layer reflects light such that the light condenses before the light contacts a light receiving surface of a photoelectric conversion element in the pixel that is adjacent to the side of the tapered shape of the second separation layer.

4. The image pickup device according to claim 1, wherein the back surface of the semiconductor substrate is a light incident surface, and wherein the upper surface of the second separation layer, upper edges of the anti-reflection film, and a light incident surface of each of the two color filters are a first distance from the back surface of the semiconductor substrate.

5. The image pickup device according to claim 2, wherein the second separation layer is made of the same material as the first separation layer.

6. The image pickup device according to claim 1, wherein a refractive index of the second separation layer is lower than a refractive index of the color filters.

7. The image pickup device according to claim 1, further comprising a film having a negative fixed charge and an insulating film each provided between the groove and the first separation layer.

8. An electronic apparatus comprising the image-pickup device according to claim 1.

* * * * *